United States Patent
Katta et al.

(10) Patent No.: US 9,367,660 B2
(45) Date of Patent: Jun. 14, 2016

(54) ELECTROMIGRATION-AWARE LAYOUT GENERATION

(71) Applicant: TAIWAN SEMICONDUCTOR MANUFACTURING COMPANY LTD., Hsinchu (TW)

(72) Inventors: Nitesh Katta, Hsinchu (TW); Jerry Chang-Jui Kao, Taipei (TW); Chin-Shen Lin, Taipei (TW); Yi-Chuin Tsai, Pintung Country (TW); Chien-Ju Chao, New Taipei (TW); Kuo-Nan Yang, Hsinchu (TW); Chung-Hsing Wang, Hsinchi (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 172 days.

(21) Appl. No.: 14/218,147

(22) Filed: Mar. 18, 2014

(65) Prior Publication Data

US 2015/0269302 A1 Sep. 24, 2015

(51) Int. Cl.
*G06F 17/50* (2006.01)

(52) U.S. Cl.
CPC ........ *G06F 17/5081* (2013.01); *G06F 17/5031* (2013.01); *G06F 17/5072* (2013.01); *G06F 17/5077* (2013.01); *G06F 17/5068* (2013.01)

(58) Field of Classification Search
None
See application file for complete search history.

(56) References Cited

U.S. PATENT DOCUMENTS

| | | | | |
|---|---|---|---|---|
| 5,581,475 A * | 12/1996 | Majors | ................ | G06F 17/5081 716/112 |
| 6,202,191 B1 * | 3/2001 | Filippi | ................ | G06F 17/5077 257/522 |
| 6,249,898 B1 * | 6/2001 | Koh | ................ | G01R 31/31835 716/109 |
| 6,887,791 B2 * | 5/2005 | Jung | ................... | G06F 17/5036 257/E21.582 |
| 7,346,869 B2 * | 3/2008 | Tai | ....................... | G06F 17/5068 716/111 |
| 7,556,971 B2 * | 7/2009 | Peacock | ............. | G01R 31/2858 438/10 |
| 7,721,237 B2 * | 5/2010 | Scheffer | .............. | G06F 17/5009 716/113 |
| 7,721,245 B2 * | 5/2010 | Maziasz | .............. | G06F 17/5077 716/123 |
| 7,971,171 B2 * | 6/2011 | Keinert | ................ | G06F 17/5036 716/112 |
| 8,381,162 B2 * | 2/2013 | Pelloie | ................ | G06F 17/5068 716/122 |
| 8,560,990 B2 * | 10/2013 | Barwin | ............... | G06F 17/5068 716/110 |
| 8,694,945 B2 * | 4/2014 | Wang | .................. | H01L 23/5286 257/786 |
| 8,826,203 B2 * | 9/2014 | Darringer | ........... | G06F 17/5081 703/16 |
| 8,843,873 B1 * | 9/2014 | Sharma | ............... | G06F 17/5036 716/132 |
| 2009/0293033 A1 * | 11/2009 | Ito | ....................... | G06F 17/5068 716/113 |
| 2011/0080175 A1 * | 4/2011 | Jain | ..................... | G06F 17/5081 324/459 |
| 2014/0181780 A1 * | 6/2014 | Burd | .................. | G06F 17/5036 716/136 |
| 2015/0143317 A1 * | 5/2015 | Gibson | .............. | G06F 17/5036 716/115 |

OTHER PUBLICATIONS

Nitesh Katta, U.S. Appl. No. 14/059,332 (not yet published). Application Date Oct. 21, 2013.

* cited by examiner

*Primary Examiner* — Leigh Garbowski
(74) *Attorney, Agent, or Firm* — WPAT, P.C., Intellectual Property Attorneys; Anthony King

(57) ABSTRACT

In some embodiments, in a method, cell layouts of a plurality of cells are received. For each cell, a respective constraint that affects a geometry of an interconnect to be coupled to an output pin of the cell in a design layout is determined based on a geometry of the output pin of the cell in the cell layout.

20 Claims, 21 Drawing Sheets

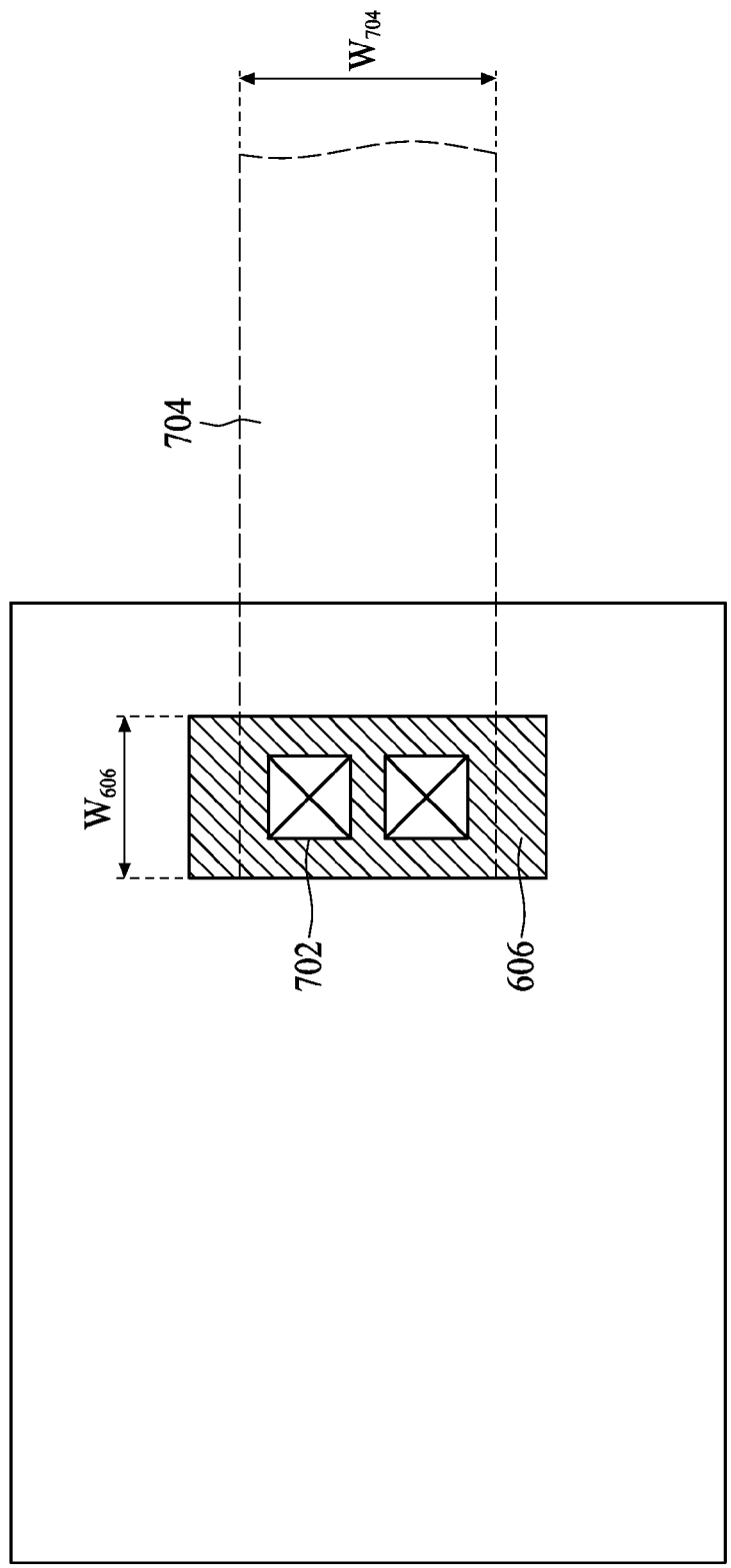

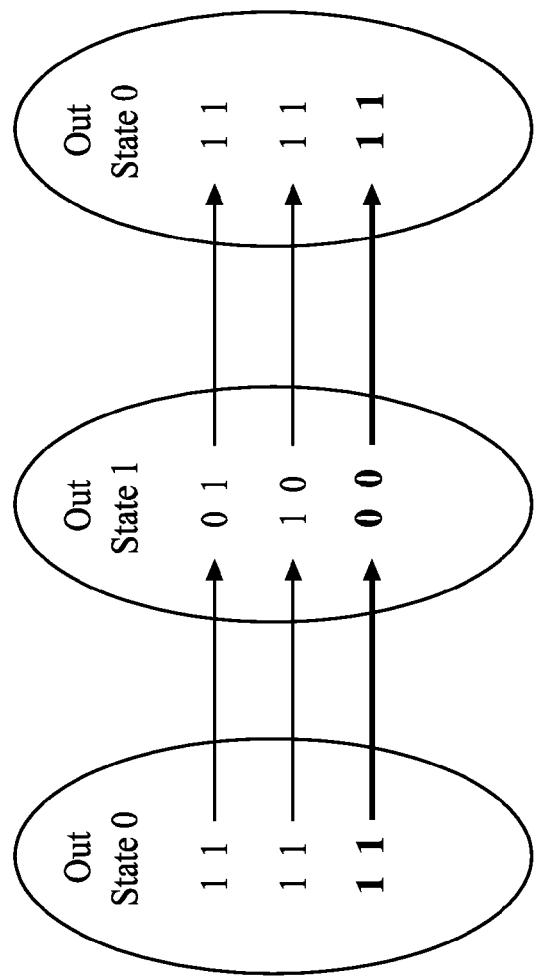
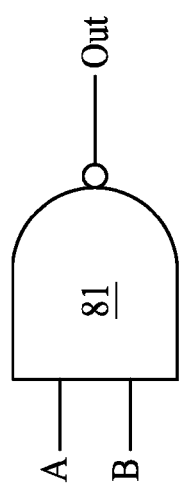
FIG. 8C
FIG. 8A
FIG. 8B

ELECTROMIGRATION-AWARE LAYOUT GENERATION

BACKGROUND

With the continual scaling of feature size and the ever-expanding functionalities of chips, sizes of wires that connect components in a chip are also reduced, causing current densities through the wires to increase. A life span of a wire is subject to electromigration, which is a material transport caused by transfer of momentum between conducting electrons and metal ions. Electromigration can cause the formation of hillocks or voids in the wire, which can lead to short circuit or open circuit. A mean time to failure (MTTF) of the wire, when estimated taking electromigration into consideration, decreases with the increase of current density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a schematic diagram illustrating a situation in which an output behavior of an exemplary 4× inverter is limited by an EMS of the output pin in the cell layout of the 4× inverter, rather than by an EMS of an interconnect coupled to the output pin in accordance with some embodiments.

FIGS. 8A to 8C illustrate a manner with which a worst case EM input vector of a NAND gate is determined in accordance with some embodiments.

DETAILED DESCRIPTION

Figure 1:
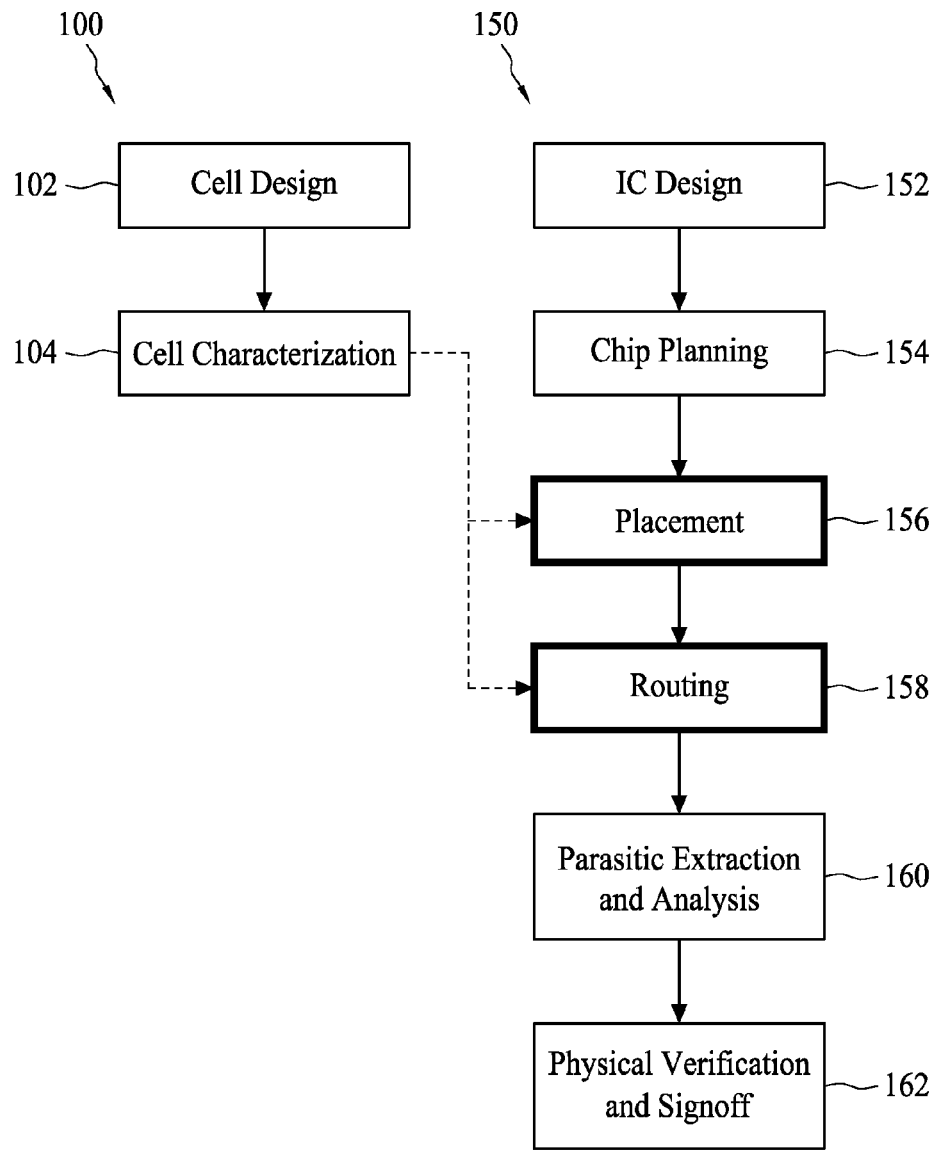
FIG. 1 is a flow diagram of at least a portion of a cell design flow and a chip design flow of an integrated circuit chip in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a flow diagram of at least a portion of a cell design flow 100 and a chip design flow 150 of an integrated circuit (IC) chip in accordance with some embodiments. The cell design flow 100 provides physical designs of standard cells and characteristics of the cells for the cells to be employed as building blocks in the chip design flow 150. The chip design flow 150 aims at implementing an IC chip design from a high-level specification to a physical layout which is verified for, for example, functionality, performance, and power. The flows 100 and 150 utilize one or more electronic design automation (EDA) tools to carry out one or more stages in the flows 100 and 150.

In some embodiments, the cell design flow 100 includes a cell design stage 102 and a cell characterization stage 104.

At the cell design stage 102, cell design is performed at the transistor level and the circuits of the cells are physically laid out and verified according to specifications, technology-related information and design rules. Cell netlists and cell layouts are collected in a standard cell library. The term "netlist" used herein refers to both graphical-based representation such as a schematic and/or a text-based representation of a circuit.

At the cell characterization stage 104, the physically implemented cells are characterized to facilitate the selection of the appropriate cells with respect to a design specification in the chip design flow 150. For EM awareness in the chip design flow 150, electromigration susceptibility (EMS) of the cells are characterized and collected in the standard cell library, as will be described in further detail with reference to FIG. 5.

In some embodiments, the chip design flow 150 includes an IC design stage 152, a chip planning stage 154, a placement stage 156, a routing stage 158, a parasitic extraction and analysis stage 160, and a physical verification and signoff stage 162. In the present disclosure, a digital design flow is used as an example. Other design flows, such as an analog standard cell design flow, are within the contemplated scope of the present disclosure.

At the IC design stage 152, a design of the IC chip is provided by a circuit designer. For the digital design flow, a gate-level netlist is generated through logic synthesis based on the design by the circuit designer and the gates are mapped to the available cells in the standard cell library.

At the chip planning stage 154, the gate-level netlist is partitioned into blocks and a floorplan for the blocks in a design layout of the IC chip is created.

At the placement stage 156, the mapped cells of logic gates and registers in the blocks are placed at specific locations in the design layout. In some embodiments, constraints related to, for example, distances between the cells can be generated based on the characterized EMSes of the cells and applied when the placement are iteratively refined for a more EM-aware placement.

At the routing stage 158, interconnects between the placed cells in the design layout are routed in accordance with routing constraints such as non-default routing (NDR) rules. The NDR relates to, for example, double or triple width wire, double or triple spacings between wires, a tapering rule, a number of via cuts, or other non-default via configurations. In some embodiments, NDRs for wire widths of the interconnects are generated based on the characterized EMSes of the cells and are applied during routing for the routing stage 158 to be more EM-aware.

At the parasitic extraction and analysis stage 160, a physical netlist is extracted from the layout of the IC chip. The physical netlist includes parasitics such as parasitic resistors and capacitors introduced by the interconnects to the driver cells. Timing analysis can be performed on the physical netlist and post-route optimization can be performed on the design layout based on the analysis result to achieve timing closure of the chip design.

At the physical verification and signoff stage 162, layout-versus-schematic (LVS) is performed on the physical netlist to ensure correspondence of the design layout to the gate-level netlist. Further, design rule check (DRC) is performed on the design layout to ensure the design clean of, for example, electrical issues, lithographic issues for manufacturing. Incremental fixing can be performed to achieve final signoff of the design before tape-out.

The cell design flow 100 and the chip design flow 150 in FIG. 1 are exemplary. Other sequence of the stages, partition of the stages, or additional stages before, between or after the stages shown are within the applicable scope of the present disclosure.

Figure 2:
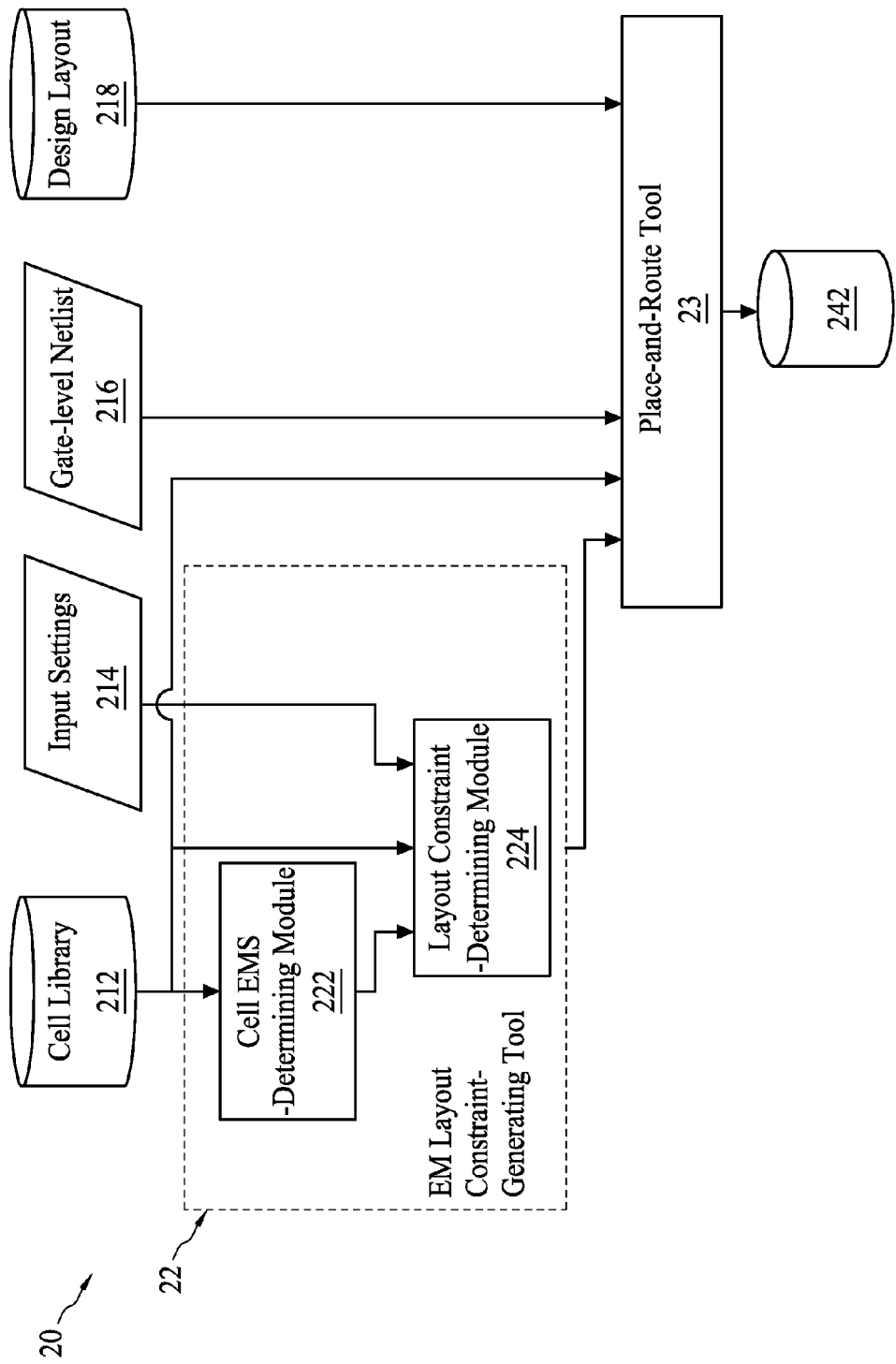
FIG. 2 is a functional block diagram of an EM-aware layout generation system in accordance with some embodiments.

FIG. 2 is a functional block diagram of an EM-aware layout generation system 20 in accordance with some embodiments. The EM-aware layout generation system 20 includes an EM layout constraint-generating tool 22 and a place-and-route tool 23. In some embodiments, the EM layout constraint-generating tool 22 is employed at the cell characterization stage 104 in the cell design flow 100 in FIG. 1 and the place-and-route tool 23 is used at the placement 156 and routing stage 158 in the chip design flow 150. The EM layout constraint-generating tool 22 includes a cell EMS-determining module 222 and a layout constraint-determining module 224. The cell EMS-determining module 222 is configured to receive cell layouts in a standard cell library 212, and determine, for each cell, a respective EMS of an output pin of the cell. In some embodiments, the layout constraint-determining module 224 is configured to receive cell netlists in the standard cell library 212, input settings 214 such as worst case EM input vectors for the cells, respectively, and the EMSes determined by the module 222 for the cells, respectively, and generate, for each cell, respective layout constraints that affect a geometry of an interconnect that will couple to the cell in a design layout. The place-and-route tool 23 is configured to receive a gate-level netlist 216 of a chip design, and a floorplan of a design layout 218 of the chip design, the cell layouts in the standard cell library 212, and the layout constraints from the layout constraint-determining module 224, and perform placement and routing in the design layout 218 in accordance with the layout constraints to generate a placed and routed design layout 242.

Figure 3:
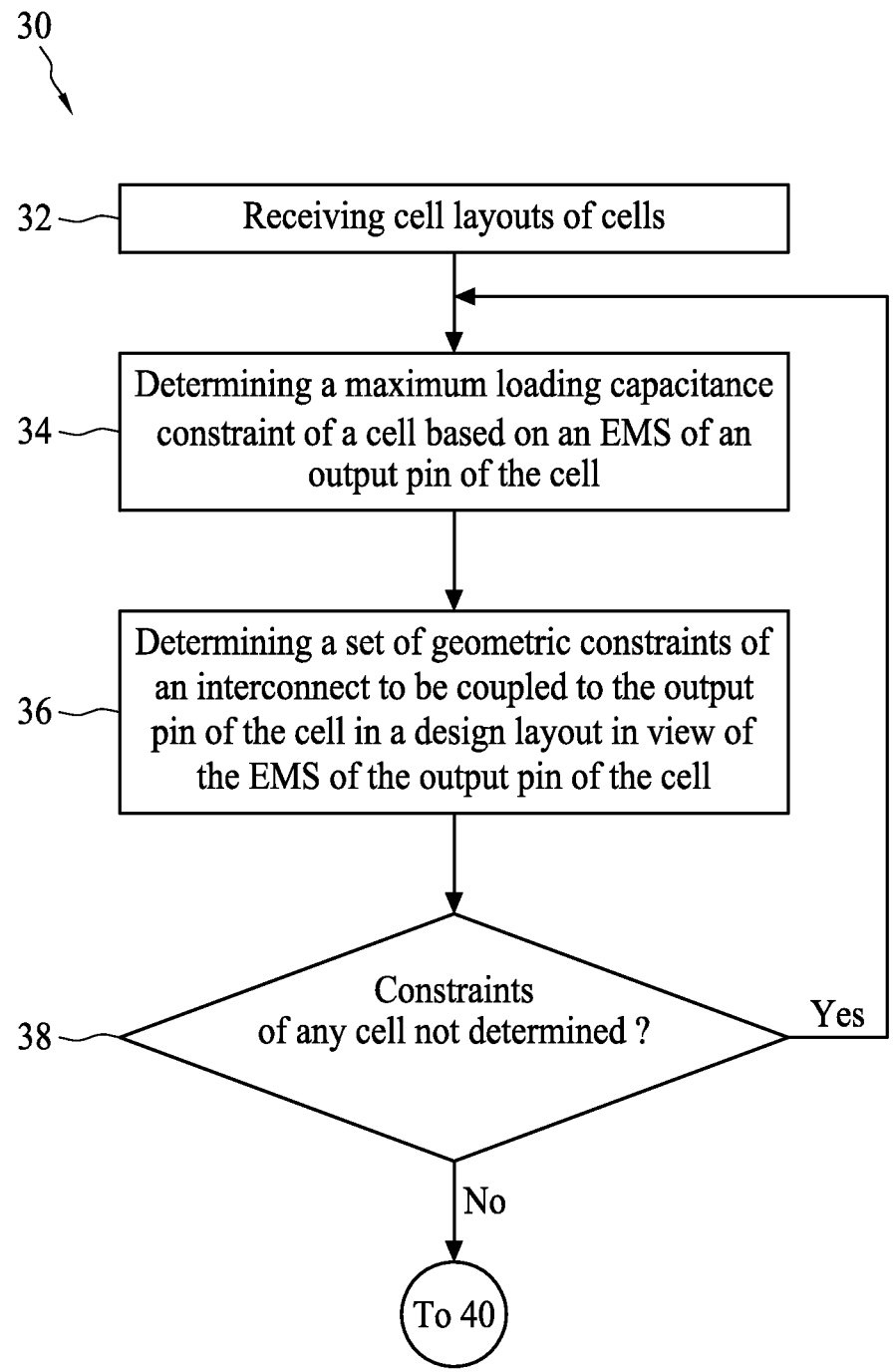
FIG. 3 is a flow diagram of an EM layout constraint-generating method in accordance with some embodiments.

FIG. 3 is a flow diagram of an EM layout constraint-generating method 30 in accordance with some embodiments. In some embodiments, the method 30 is performed during the cell characterization stage 104 in FIG. 1. In operation 32, cell layouts of several cells such as standard cells in a standard cell library are received. In operation 34, for a cell, a maximum loading capacitance constraint is determined based on an EMS of an output pin of the cell. In operation 36, a set of geometric constraints of an interconnect that will be coupled to the output pin of the cell in a design layout is determined in view of the EMS of the output pin of the cell. In operation 38, if layout constraints for any cell in the standard cell library are not determined, the method 30 loops back to the operation 34 to determine the layout constraints for another cell; otherwise, the layout constraints for the cells are generated and available for use in an EM-aware placement and routing method 40 in FIG. 4.

Figure 4:
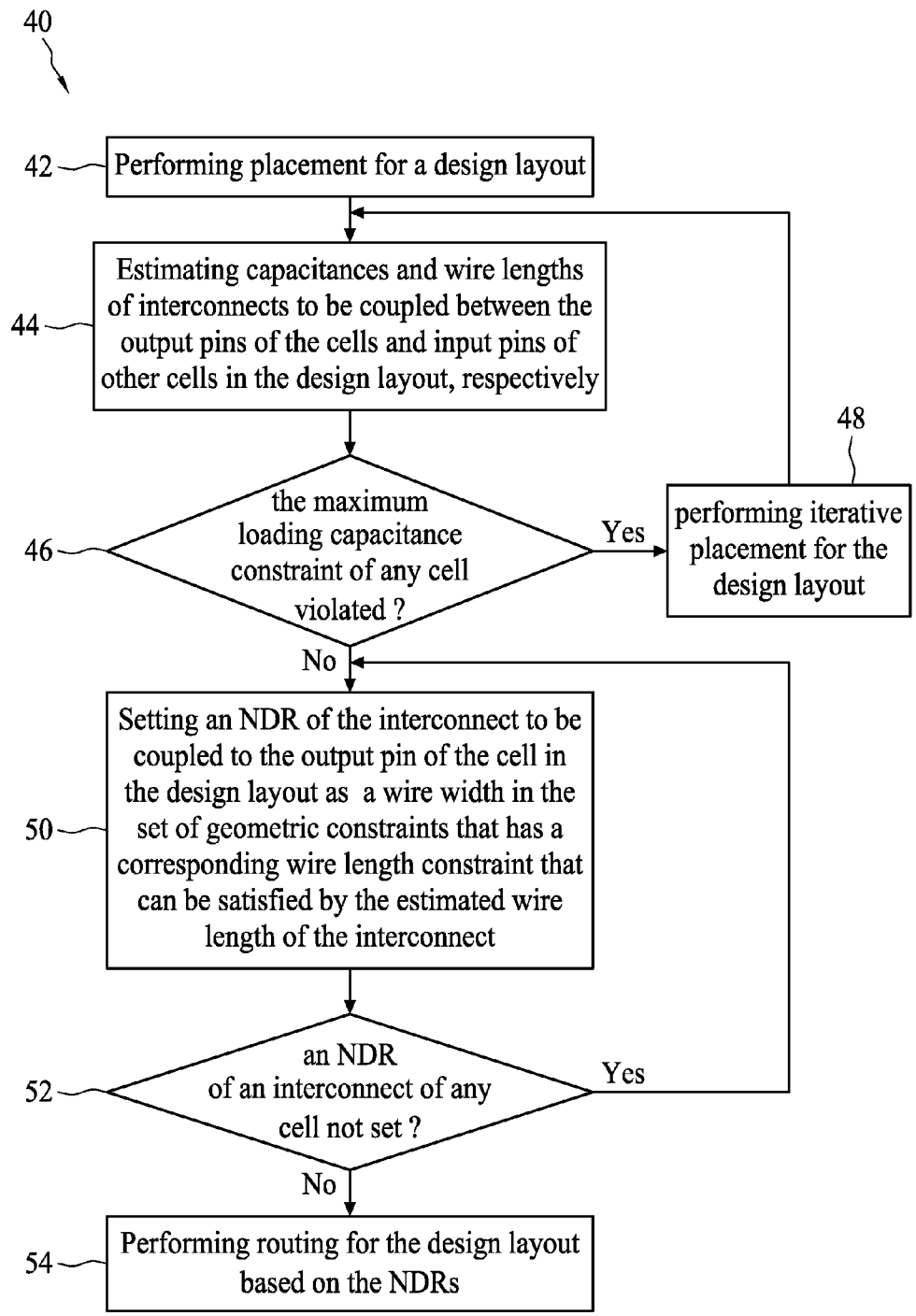
FIG. 4 is a flow diagram of an EM-aware placement and routing method in accordance with some embodiments.

FIG. 4 is a flow diagram of the EM-aware placement and routing method 40 in accordance with some embodiments. In some embodiments, the method 40 is performed in the placement stage 156 and routing stage 158 in FIG. 1. In operation 42, placement for a design layout that includes the cells is performed. In operation 44, capacitances and wire lengths of interconnects to be coupled between the output pins of the cells and input pins of other cells in the design layout are estimated, respectively. In operation 46, if the maximum loading capacitance constraint of any cell in the design layout is violated, then the method 40 performs iterative placement for the design layout in operation 48 and loops back to the operation 44. If the maximum loading capacitance constraints of all the cells in the design layout are satisfied, then the method 40 proceeds to operation 50. In operation 50, for a cell in the design layout, an NDR of the interconnect to be coupled to the output pin of the cell is set according to a wire width in the set of geometric constraints that has a corresponding wire length constraint that can be satisfied by the estimated wire length of the interconnect. In operation 52, if an NDR of an interconnect of any cell in the design layout is not set, the method 40 loops back to the operation 50 to set the NDR for another cell; otherwise, routing for the design layout is performed based on the NDRs in operation 54.

Figure 5:
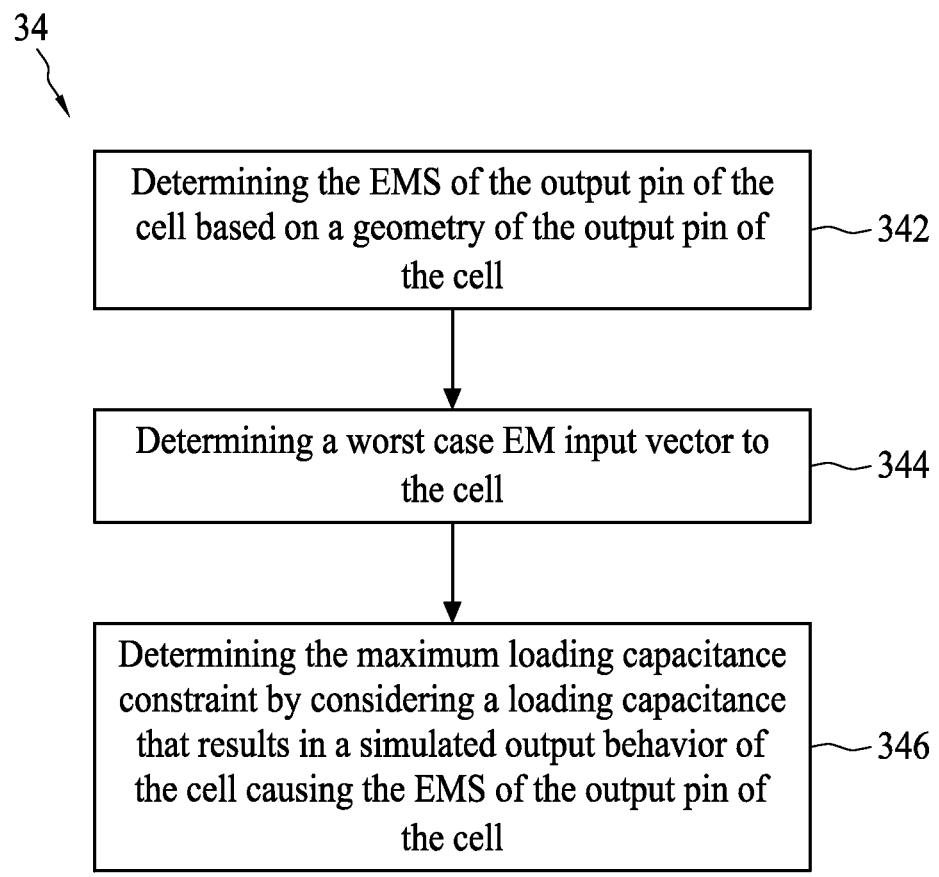
FIG. 5 is a flow diagram of a method performed in the operation 34 in FIG. 3 for determining a maximum loading capacitance constraint based on an EMS of an output pin of the cell in accordance with some embodiments.

FIG. 5 is a flow diagram of a method performed in the operation 34 in FIG. 3 for determining a maximum loading capacitance constraint based on an EMS of an output pin of the cell in accordance with some embodiments. In operation 342, the EMS of the output pin of the cell is determined based on the geometry of the output pin of the cell. In operation 344, a worst case EM input vector to the cell is determined. In operation 346, the maximum loading capacitance constraint is determined by considering a loading capacitance that results in a simulated output behavior of the cell causing the EMS of the output pin of the cell.

Figure 6:
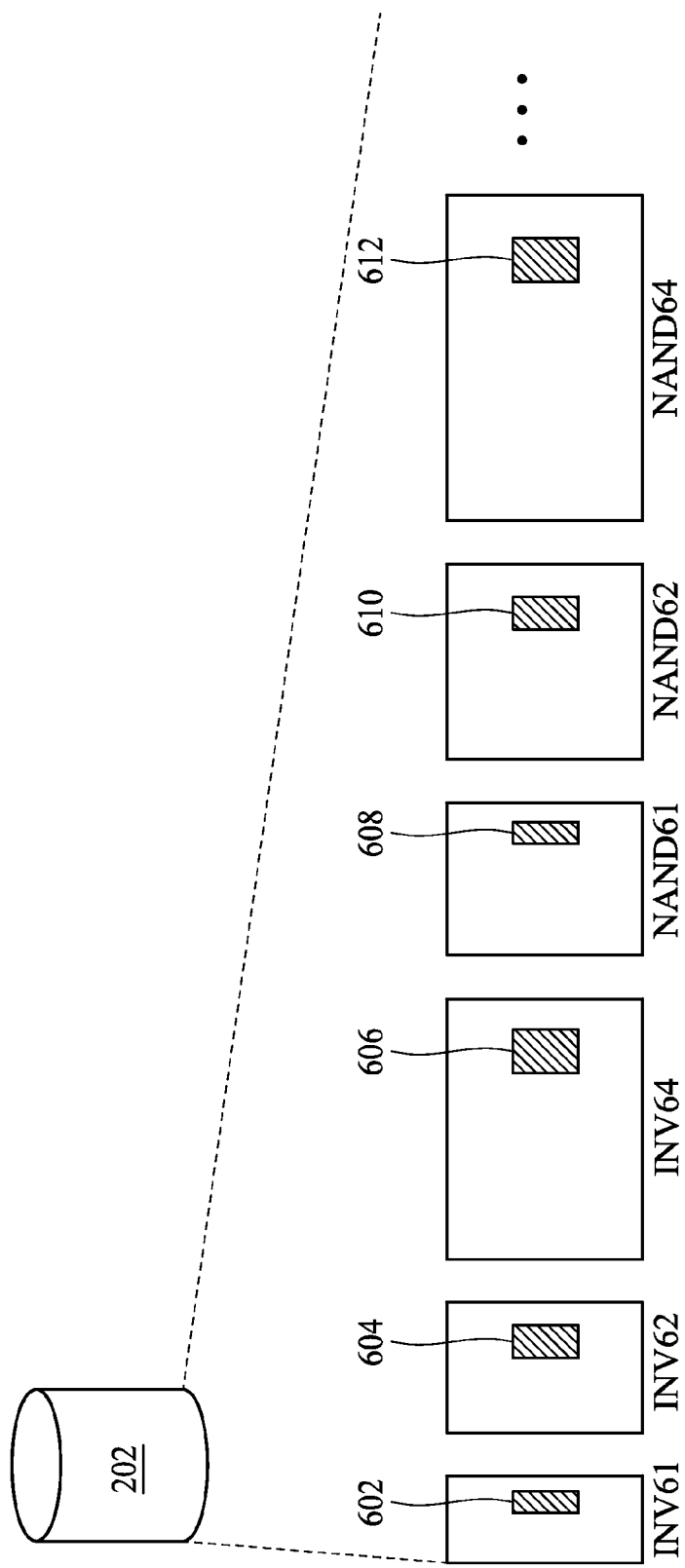
FIG. 6 is a schematic diagram of a standard cell library in accordance with some embodiments.

FIG. 6 is a schematic diagram of a standard cell library 212 in accordance with some embodiments. In the embodiments described with reference to FIG. 2, the standard cell library 212 is received by the cell EMS-determining module 222. In the embodiments described with reference to FIG. 3, in operation 32, the cell layouts INV61, INV62, INV64, NAND61, NAND62, NAND64, . . . of a minimum-sized (1×) inverter, a double-sized (2×) inverter, a quadruple-sized (4×) inverter, a 1×NAND gate, a 2×NAND gate, a 4×NAND gate, . . . are received. As illustrated in FIG. 6, the standard cell library 212 includes cell layouts of standard cells such as the cell layout INV61 of the 1× inverter, the cell layout INV62 of the 2× inverter, the cell layout INV64 of the 4× inverter, the cell layout NAND61 of the 1×NAND gate, the cell layout NAND62 of the 2×NAND gate, the cell layout NAND 64 of the 4×NAND gate and so forth. Each cell layout INV61, INV62, INV64, NAND 61, NAND62 or NAND 64 has a respective output pin 602, 604, 606, 608, 610 or 612. In some embodiments, the widths of the output pins 602, 604 and 606, or 608, 610 and 612 increase with as the sizes of the gates increase from 1× to 4×. Other sizing arrangements of the output pins are within the contemplated scope of the present disclosure.

FIG. 7A is a schematic diagram illustrating a situation in which an output behavior of an exemplary 4× inverter is limited by an EMS of the output pin 606 in the cell layout INV64 of the 4× inverter, rather than by an EMS of an interconnect 704 coupled to the output pin 606 in accordance with some embodiments. In the embodiments described with reference to FIG. 2, the EM layout constraint-generating tool 22 employs the cell EMS-determining module 222 to determine the EMS of the output pin 606 of the 4× inverter, and the layout constraint-determining module 224 to determine the layout constraint that affects the geometry of the interconnect to be coupled to the 4× inverter according to the EMS of the output pin 606 of the 4× inverter. In the embodiments described with reference to FIG. 3, in operations 34 and 36, the maximum loading capacitance constraint of the 4× inverter and the set of geometric constraints of the interconnect to be coupled to the output pin 606 of the 4× inverter in the design layout are determined based on the EMS of the output pin 606 of the cell. In some embodiments, an EMS of a wire is a current limit of the wire to ensure a certain EM reliability of the wire. In some embodiments, failure due to EM of a wire is expressed by Black's equation:

$$MTTF = \frac{A}{J^2} \cdot \exp\left(\frac{E_a}{k \cdot T}\right) \quad (1)$$

where A is a material constant, J is a current density, $E_a$ is an activation energy, k is the Boltzmann constant, and T is a temperature. To ensure a certain EM reliability of the wire, a current density J of the wire at a corresponding temperature T is limited to achieve a target MTTF. The current density limit can be a peak current density limit, an average current density limit, a DC current density limit, or a root mean square (RMS) current density limit. Current density limits at corresponding temperatures are usually defined as EM design rules in a design rule manual. Based the corresponding EM design rule, a width and a predetermined thickness of the wire, a current limit such as a peak current limit, an average current limit, a DC current limit, or an RMS current limit of the wire is calculated. In some embodiments, the EMS of the wire is reflected by the current limit of the wire. In other words, the smaller the current limit of the wire is, the greater the EMS of the wire is. As shown in FIG. 7A, a width $W_{606}$ of the output pin 606 is smaller than a width $W_{704}$ of the interconnect 704 coupled to the output pin 606 through vias 702. By applying the width $W_{606}$ and the width $W_{704}$ to the same EM design rule, respectively, the obtained current limit of the output pin 606 is smaller than that of the interconnect 704. Therefore, the output behavior such as the output current of the 4× inverter is limited by the EMS such as the current limit of the output pin 606, rather than by the EMS such as the current limit of the interconnect 704.

Referring to FIG. 7A, in the embodiments described with reference to FIG. 2, the cell EMS-determining module 222 determines the respective EMS for each cell such as the 4× inverter in the standard cell library 212 based on the width $W_{606}$ of the output pin 606 of the 4× inverter. In the embodiments described with reference to FIG. 5, in operation 342, the EMS of the output pin 606 of the 4× inverter is determined based on the width $W_{606}$ of the output pin 606 of the 4× inverter. In FIG. 7A, the output pin 606 of the 4× inverter is exemplarily shown as a single line segment. Therefore, the width $W_{606}$ of the output pin 606 for determining the EMS of the output pint 606 is the width of the line segment. In other embodiments described in the following, the output pin has multiple line segments.

Figure 7B:
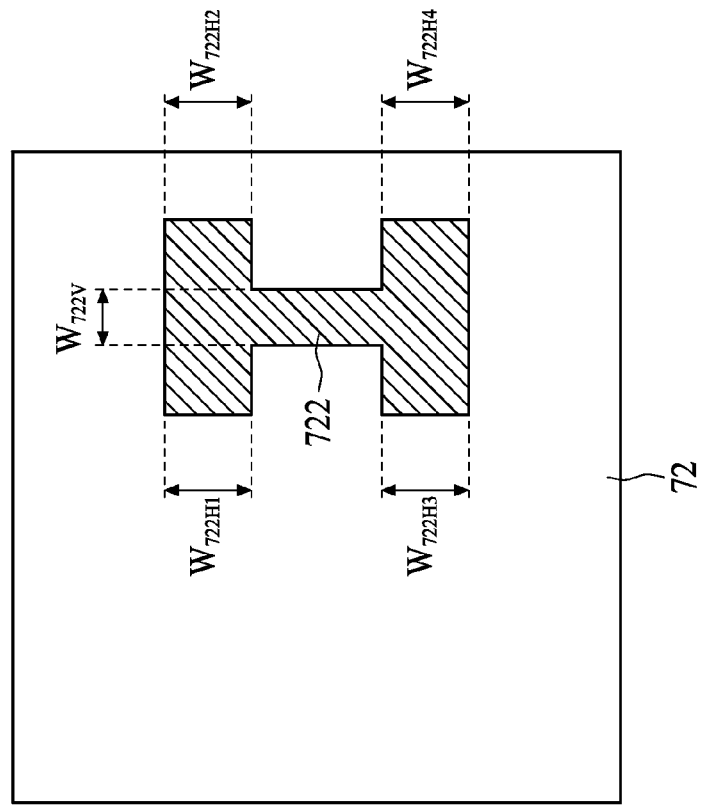
FIG. 7B is a schematic diagram illustrating a geometry of a multi-segment output pin in a cell layout used to determine the EMS of the cell with the cell layout in accordance with some embodiments.
Figure 7B:
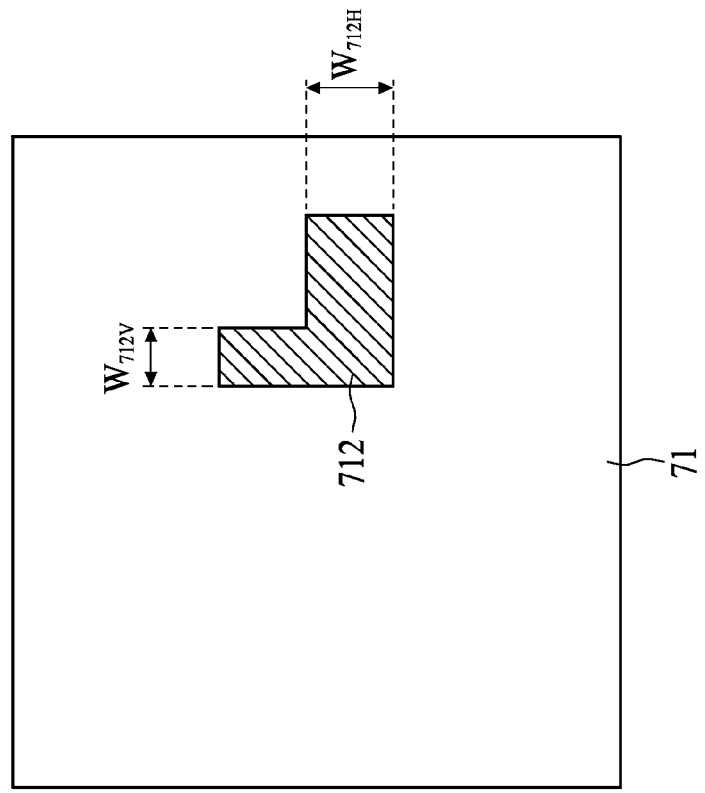

FIG. 7B is a schematic diagram illustrating a geometry of a multi-segment output pin 712 or 722 in a cell layout 71 or 72 used to determine the EMS of the cell in accordance with some embodiments. A width of the output pin 712 or 722 for determining an EMS of the output pin 712 or 722 is a width of the thinnest segment of the output pin 712 or 722. For example, the output pin 712 has an L shape and is formed by a vertical segment with a width $W_{712V}$ and a horizontal segment with a width $W_{712H}$. The width $W_{712V}$ is thinner than the width $W_{712H}$ and is selected as the geometry of the output pin 712 for calculating the EMS of the cell with the cell layout 71. For another example, the output pin 722 has an I shape, and is formed by a vertical segment with a width $W_{722V}$, two horizontal segments with widths $W_{722H1}$ and $W_{722H3}$, respectively, on one side of the vertical segment, and two horizontal segments with widths $W_{722H2}$ and $W_{722H4}$, respectively, on the other side of the vertical segment. The width $W_{722V}$ is the thinnest among the widths $W_{722V}$, $W_{722H1}$, $W_{722H2}$, $W_{722H3}$ and $W_{722H4}$ and is selected as the geometry of the output pin 722 for calculating the EMS of the cell with the cell layout 72. Further, in some embodiments, if a predefined region in an output pin where vias for coupling the output pin to an interconnect will be formed is known at the cell characterization stage 104 in FIG. 1, a width of the thinnest segment of the predefined region is used to calculate the EMS of the cell. In addition, in some embodiments, if a predefined region in an output pin where via formation is forbidden is known at the cell characterization stage 104 in FIG. 1, the predefined region is avoided when identifying the width for calculating the EMS of the output pin of the cell.

FIGS. 8A to 8C illustrate a manner with which a worst case EM input vector of a NAND gate 81 is determined in accordance with some embodiments. FIG. 8A is a schematic circuit diagram of a NAND gate 81. FIG. 8B is a truth table of the NAND gate 81. FIG. 8C illustrate the possible input vectors causing the 0→1 transition and 1→0 transition in the output Out of the NAND gate 81. In the embodiments described with reference to FIG. 2, for generating the layout constraint that affects the geometry of the interconnect coupled to the output pin of the cell such as the NAND gate 81, the layout constraint-determining module 224 receives the input settings 214 that contain the worst case EM input vector (1,1)→(0, 0)→(1,1). In the embodiments described with reference to FIG. 5, in operation 344, the worst case EM input vector (1,1)→(0,0)→(1,1) to the NAND gate 81 is determined. In FIG. 8A, the NAND gate 81 has two inputs A and B, and an output Out. In FIG. 8B, for generating the worst case EM input vector, the truth table of the NAND gate 81 is generated. In the truth table, outcome states of the output Out with respect to enumerated states of received inputs are generated. According to the truth table in FIG. 8B, when the inputs A and B are both "1", the state of the output Out is "0", and when either or both the inputs A and B are "0", the state of the output Out is "1". Then, as shown in FIG. 8C, based on the truth table in FIG. 8B, possible input vectors that cause the output Out to toggle from a first state to a second state such as 0→1 or 1→0, and then toggling from the second state to the first state such as 1→0 or 0→1 are obtained. An input vector is a sequence of inputs that cause the output transitions 0→1 and 1→0. In FIG. 8C, there are three possible input vectors that will cause the output Out to transition from "0" to "1" and then "1" to "0". The first input vector of the inputs A and B is (1,1)→(0,1)→(1,1). In other words, the input A transitions from "1" to "0" and then from "0" to "1" while the input B stays at "1". The second input vector of the inputs A and B is (1,1)→(1,0)→(1,1). In other words, the input B transitions from "1" to "0" and then from "0" to "1" while the input A stays at "1". The third input vector of the inputs A and B is (1,1)→(0,0)→(1,1). In this case, both the inputs A and B transition from "1" to "0" and then from "0" to "1". After the possible input vectors are generated, an output current such as a peak output current or an RMS output current in response to each input vector is determined by, for example, simulations. The input vector with the largest output current is the worst case EM input vector. For the NAND gate 81, the worst case EM input vector is the one with both the inputs A and B transition from "1" to "0" and then from "0" to "1".

Figure 9A:
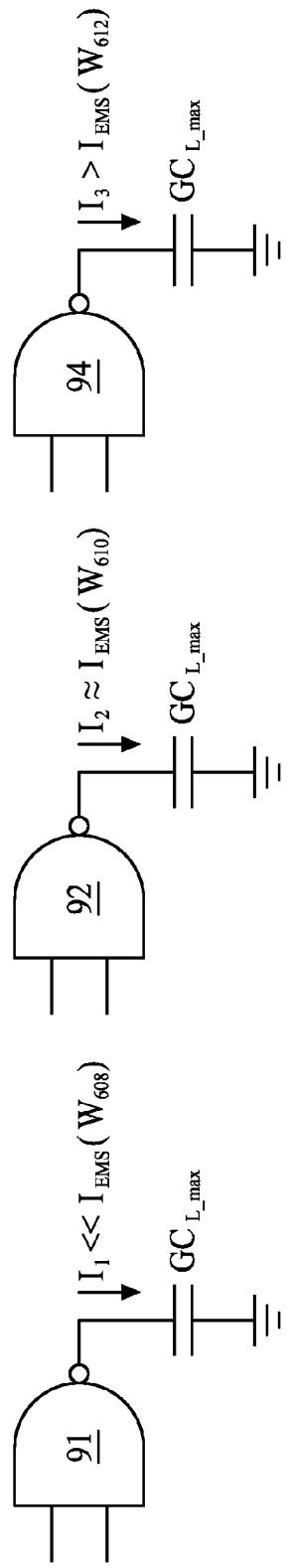
FIG. 9A illustrates schematic circuit diagrams of a 1×NAND gate, a 2×NAND gate and a 4×NAND gate with a globally set maximum loading capacitance constraint.
Figure 9B:
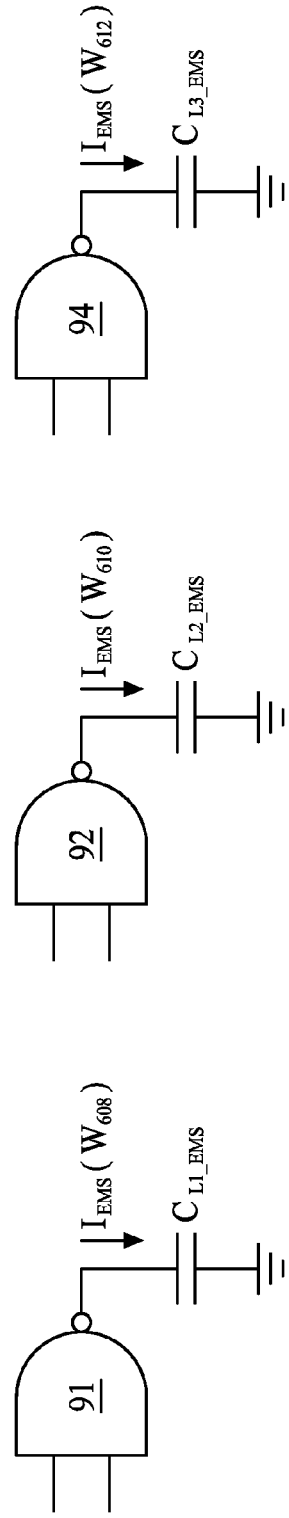
FIG. 9B illustrates schematic circuit diagrams of a 1×NAND gate, a 2×NAND gate and a 4×NAND gate with respectively set maximum loading capacitance constraints in accordance with some embodiments.

FIG. 9A illustrates schematic circuit diagrams of a 1×NAND gate 91, a 2×NAND gate 92 and a 4×NAND gate 94 with a globally set maximum loading capacitance constraint. In comparison to FIG. 9A, FIG. 9B illustrates schematic circuit diagrams of a 1×NAND gate 91, a 2×NAND gate 92 and a 4×NAND gate 94 with respectively set maximum loading capacitance constraints in accordance with some embodiments. Referring to FIG. 9B, in the embodiments described with reference to FIG. 2, the layout constraint-determining module 224 generates the layout constraint $C_{L1\_EMS}$, $C_{L2\_EMS}$ or $C_{L3\_EMS}$ of the interconnect to be coupled to the output pin 608, 610 or 612 shown in FIG. 6 of the cell 91, 92 or 94 based on the cell netlist in the standard cell library 212, the cell EM current limit $I_{EMS}(W_{608})$, $I_{EMS}(W_{610})$ or $I_{EMS}(W_{612})$ determined by the cell EMS-determining module 222 and the input settings 214 containing the worst case EM input vector. In the embodiments described with reference to FIG. 5, in operation 346, the maximum loading capacitance constraint $C_{L1\_EMS}$, $C_{L2\_EMS}$ or $C_{L3\_EMS}$ is determined by considering a loading capacitance that results in a simulated output behavior of the cell 91, 92 or 94 causing the EM current limit $I_{EMS}(W_{608})$, $I_{EMS}(W_{610})$ or $I_{EMS}(W_{612})$ of the output pin 608, 610 or 612 of the cell 91, 92 or 94. For comparison purpose, in FIG. 9A, the global maximum loading capacitance constraint $GC_{L\_max}$ is applied to each of the 1×NAND gate 91, 2×NAND gate 92 and 4×NAND gate 94. Suppose under the global maximum loading capacitance constraint $GC_{L\_max}$, the 2×NAND gate 92 has an output current $I_2$ such as a peak current closer to causing the EM current limit $I_{EMS}(W_{610})$ of the output pin 610 of the 2×NAND gate 92. Under the same maximum loading capacitance constraint $GC_{L\_max}$, the 4×NAND gate 94 has an output current $I_3$ that is larger than the output current $I_2$ of the 2×NAND gate 92 due to a higher driving strength. The output current $I_3$ may be even larger than the EM current limit $I_{EMS}(W_{612})$ of the output pin 612 of the 4×NAND gate 92, thereby resulting in an EM violation. On the other hand, under the same maximum loading capacitance constraint $GC_{L\_max}$, the 1×NAND gate 91 has an output current $I_1$ that is smaller than the output current $I_2$ due to a lower driving strength. Although the output current $I_1$ is smaller than the EM current limit $I_{EMS}(W_{608})$ of the output pin 608 of the 1×NAND gate 91, the output current $I_1$ may be so small that causes a timing violation. Therefore, in the embodiments in FIG. 9B, each of the 1×NAND gate 91, 2×NAND gate 92 and 4×NAND gate 94 has a respective maximum EM loading capacitance constraint $C_{L1\_EMS}$, $C_{L2\_EMS}$ or $C_{L3\_EMS}$ in accordance with the respective EMS $I_{EMS}(W_{608})$, $I_{EMS}(W_{610})$ or $I_{EMS}(W_{612})$ of the output pin 608, 610 or 612.

Figure 10:
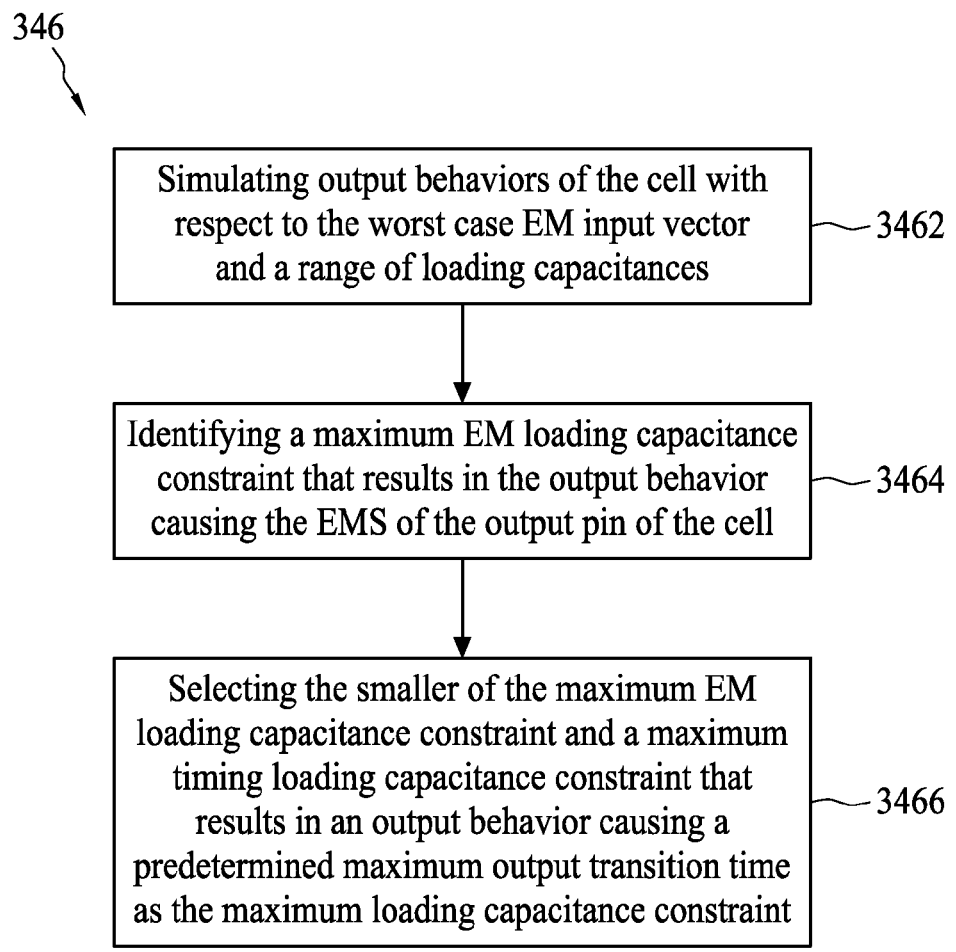
FIG. 10 is a flow diagram of a method performed by the layout constraint-determining module in FIG. 2 or a method performed in the operation 346 in FIG. 5 for determining the maximum loading capacitance constraint in accordance with some embodiments.

FIG. 10 is a flow diagram of a method performed by the layout constraint-determining module 224 in FIG. 2 or a method performed in the operation 346 in FIG. 5 for determining the maximum loading capacitance constraint in accordance with some embodiments. In operation 3462, with respect to the worst case EM input vector and a range of loading capacitances, output behaviors of the cell are simulated. In the operation 3462, instead of performing simulations for each possible input vectors, a simulation is performed using the worst case EM input vector for each value of loading capacitance. In operation 3464, a maximum EM loading capacitance constraint that results in the output behavior causing the EMS of the output pin of the cell is identified. In operation 3466, the smaller of the maximum EM loading capacitance constraint and a maximum timing loading capacitance constraint that results in an output behavior causing a predetermined maximum output transition time is selected as the maximum loading capacitance constraint.

Figure 11:
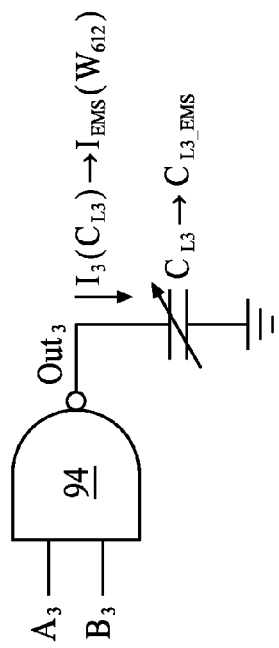
FIG. 11 is a schematic circuit diagram of a circuit for determining the maximum EM loading capacitance constraint of an exemplary 4×NAND gate in accordance with some embodiments.

FIG. 11 is a schematic circuit diagram of a circuit for determining the maximum EM loading capacitance constraint of the exemplary 4×NAND gate 94 in accordance with some embodiments. In operation 3462 in FIG. 10, the output currents $I_3(C_{L3})$ of the cell are simulated with respect to the worst case EM input vector and the range of loading capacitances $C_{L3}$. In operation 3464, the maximum EM loading capacitance constraint $C_{L3\_EMS}$ that results in the output current $I_3(C_{L3})$ causing the EM current limit $I_{EMS}(W_{612})$ of the output pin 612 of the cell 94 is identified. In FIG. 11, the output currents $I_3(C_{L3})$ of the NAND gate 94 are simulated with respect to the worst case EM input vector for the inputs $A_3$ and $B_3$ described with reference to 8C while sweeping the loading capacitance $C_{L3}$ of the NAND gate 94. The output current $I_3(C_{L3})$ that matches the EMS $I_{EMS}(W_{612})$ of the output pin 612 of the NAND gate 94 is determined to be the maximum EM loading capacitance constraint $C_{L3\_EMS}$ of the NAND gate 94. In some embodiments, the simulations are performed using a SPICE circuit simulator.

In operation 3466 in FIG. 10, the smaller of the maximum EM loading capacitance constraint $C_{L3\_EMS}$ and the maximum timing loading capacitance constraint that results in the output behavior causing the predetermined maximum output transition time is selected as the maximum loading capacitance constraint. Referring to FIG. 11, in some embodiments, the maximum timing loading capacitance constraint is determined by sweeping the loading capacitance $C_{L3}$ while simulating an output voltage $Out_3$ with respect to a worst case input vector, and identifying a loading capacitance that results in the output voltage $Out_3$ that has the same output transition time as the predetermined maximum output transition time.

Figure 12:
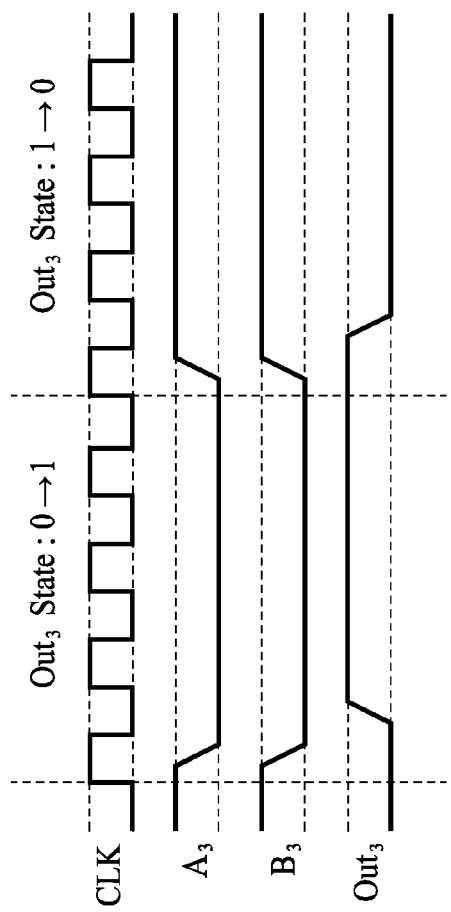
FIG. 12 is a timing diagram that illustrates a frequency of operation and a toggle rate that affect the maximum EM loading capacitance constraint of the NAND gate in FIG. 11 in accordance with some embodiments.

Furthermore, other input settings such as a frequency of operation of the chip design and a toggle rate of the cell in the chip design can affect the maximum EM loading capacitance constraint $C_{L3\_EMS}$ of the cell 94. FIG. 12 is a timing diagram that illustrates the frequency of operation and the toggle rate that affect the maximum EM loading capacitance constraint $C_{L3\_EMS}$ of the NAND gate 94 in FIG. 11 in accordance with some embodiments. After the IC design stage 152 in FIG. 1, a pre-layout simulation of the design layout is performed. A timing diagram such as the timing diagram in FIG. 12 can be generated by the pre-layout simulation. The frequency of operation of the chip design is a frequency of a clock signal CLK generated by a clock circuit of the design layout. The higher the frequency of operation is, the more frequent the output $Out_3$ of the NAND gate 94 transitions and therefore the higher the RMS current $I_3(C_{L3})$ in FIG. 11 is. Correspondingly, the maximum EM loading capacitance constraint is changed so that the RMS current $I_3(C_{L3})$ is still within the EM current limit $I_{EMS}(W_{612})$ of the output pin 612 of the NAND gate 94. In addition, the toggle rate of the NAND gate 94 in the chip design is the rate at which the output $Out_3$ changes with respect to the clock signal CLK. In the example in FIG. 12, the output $Out_3$ changes from "0" to "1" or from "1" to "0" every 4 clock cycles. Therefore, the toggle rate of the NAND gate 94 is 25%. Similar to the frequency of operation, the higher the toggle rate of the NAND gate 94 is, the higher the RMS current $I_3(C_{L3})$ is. Correspondingly, the maximum EM loading capacitance constraint is changed. In some embodiments, the cell characterization stage 104 is performed after the IC design stage 152, and therefore the simulations for determining the maximum EM loading capacitance constraint can be performed using the frequency of operation and the toggle rate available after the pre-layout simulation. In other embodiments, the cell characterization stage 104 is performed prior to the IC design stage 152. Therefore, the simulations for determining the maximum EM loading capacitance constraint are performed using default input settings. After the frequency of operation and the toggle rate are available from the pre-layout simulation, the maximum EM loading capacitance constraint is scaled accordingly.

Figure 13:
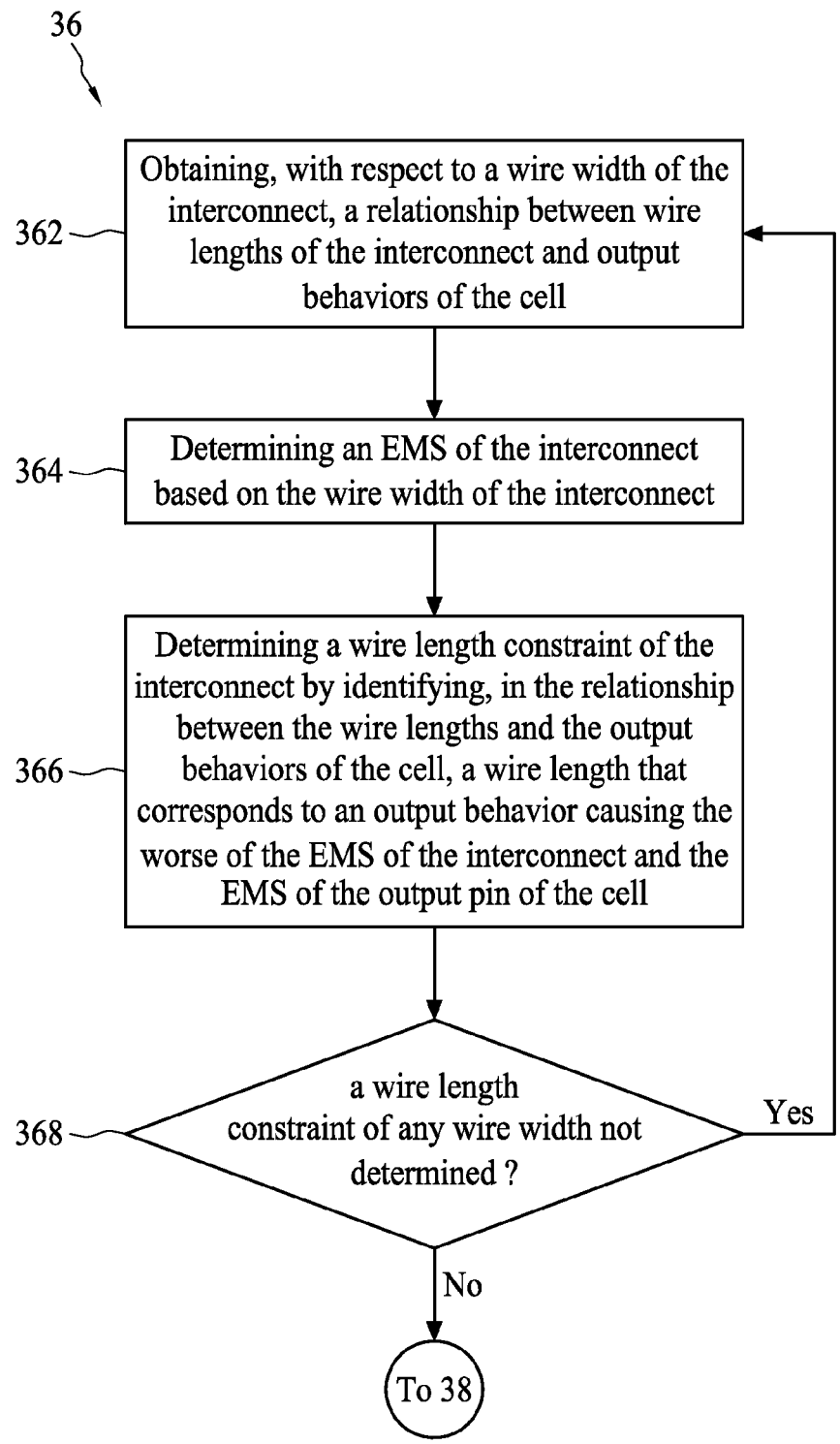
FIG. 13 is a flow diagram of another method performed by the layout constraint-determining module in FIG. 2 or a method performed in the operation 36 in FIG. 3 for determining the set of geometric constraints of the interconnect in accordance with some embodiments.

In the embodiments described with reference to FIG. 2, the layout constraint-determining module 224 generates the layout constraint of the interconnect coupled to the output pin of the cell based on the cell netlist in the standard cell library 212, the cell EMS determined by the cell EMS-determining module 222 and the input settings 214 containing the worst case EM input vector. In the embodiments described with reference to FIG. 3, in operation 36, the set of geometric constraints of the interconnect to be coupled to the output pin of the cell in the design layout is determined in view of the EMS of the output pin of the cell. FIG. 13 is a flow diagram of another method performed by the layout constraint-determining module 224 in FIG. 2 or a method performed in the operation 36 in FIG. 3 for determining the set of geometric constraints of the interconnect in accordance with some embodiments. In operation 362, with respect to a wire width of the interconnect, a relationship between wire lengths of the interconnects and output behaviors of the cell is obtained. In operation 364, an EMS of the interconnect is determined based on the wire width of the interconnect. In operation 366, a wire length constraint of the interconnect is determined by identifying, in the relationship between the wire lengths and the output behaviors of the cell, a wire length that corresponds to an output behavior causing the worse of the EMS of the interconnect and the EMS of the output pin of the cell. In operation 368, if a wire width constraint of any wire width is not determined, then the method in FIG. 13 loops back to the operation 362; otherwise, the operation 38 in FIG. 3 will be performed next.

Figure 14:
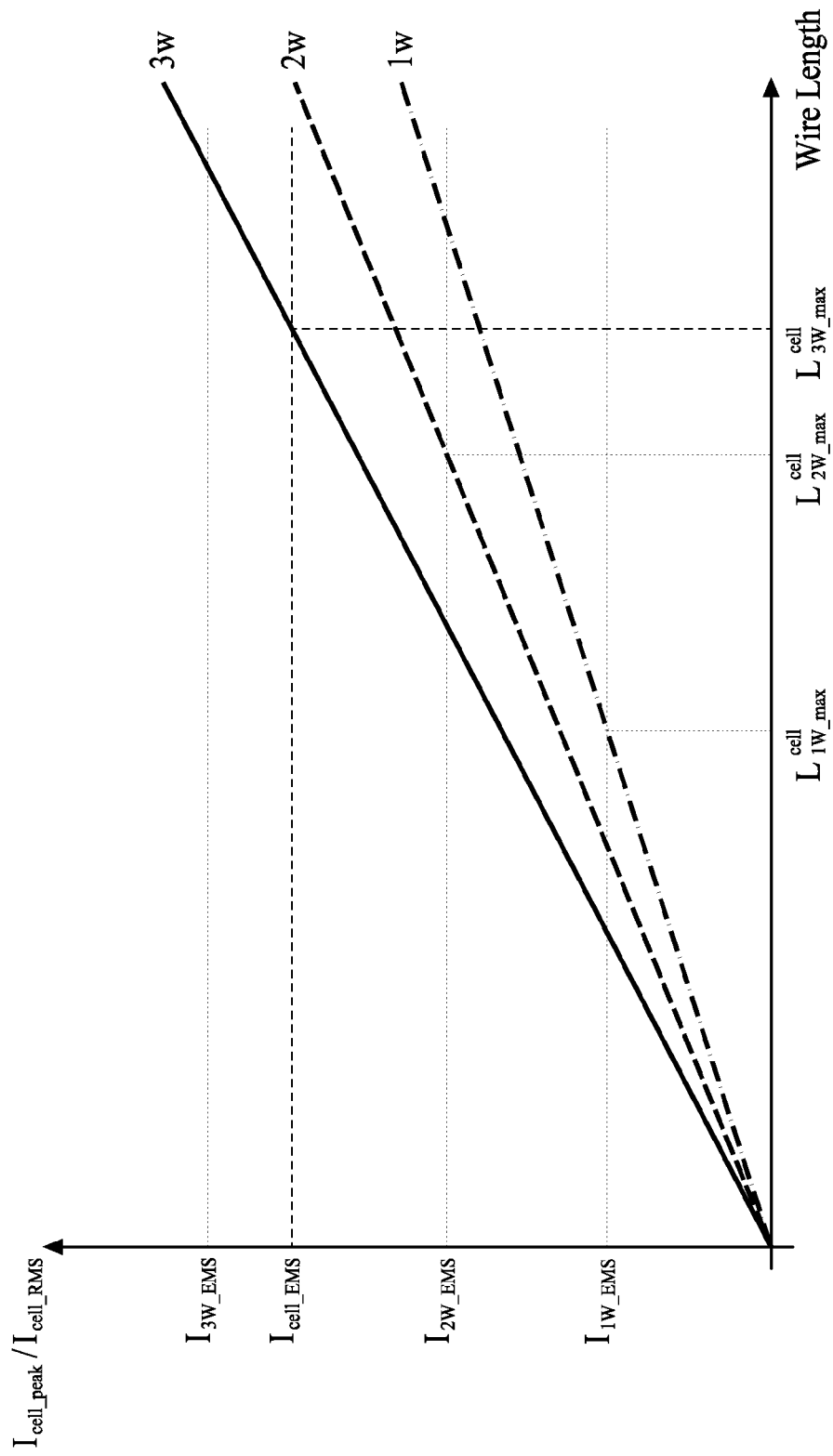
FIG. 14 is a schematic diagram illustrating wire length constraints for interconnects of different wire widths under the EMS of the cell and the EMSes of the interconnects, respectively, in accordance to some embodiments.

FIG. 14 is a schematic diagram illustrating wire length constraints for interconnects of different wire widths under the EMS of the cell and the EMSes of the interconnects, respectively, in accordance to some embodiments. In operation 362 in FIG. 13, with respect to a wire width 1w, 2w or 3w of the interconnect, a relationship between wire lengths of the interconnect and output behaviors such as peak output currents $I_{cell\_peak}$ or RMS output currents $I_{cell\_RMS}$ of the cell is obtained. In some embodiments, for generating the relationship between the wire lengths of the interconnect and the output behaviors of the cell, a layout including the cell layout such as the cell layout NAND64 of the 4×NAND gate in FIG. 6 and the interconnect with a wire width 1w, 2w or 3w, and a wire length coupled to the output pin 612 of the cell layout NAND64 is formed. A physical netlist of the layout containing the cell layout NAND64 and the interconnect is generated. By applying the worst case EM input vector described with reference to FIG. 8C to the inputs of the 4×NAND gate in the physical netlist, a peak output current $I_{cell\_peak}$ or an RMS output current $I_{cell\_RMS}$ of the 4×NAND gate is obtained. Similar operations are performed for other wire lengths until a relationship of the wire lengths and the peak output current $I_{cell\_peak}$ or the RMS output current $I_{cell\_RMS}$ for the wire width 1w, 2w or 3w is obtained.

Referring still to FIG. 14, in operation 364 in FIG. 13, an EM current limit $I_{1W\_EMS}$, $I_{2W\_EMS}$ or $I_{3W\_EMS}$ of the interconnect is determined based on the wire width 1w, 2w or 3w of the interconnect. As described with reference to FIG. 7A, the EM current limit $I_{1W\_EMS}$, $I_{2W\_EMS}$ or $I_{3W\_EMS}$ of the interconnect can be obtained by applying the wire width 1w, 2w or 3w of the interconnect to the corresponding EM design rule.

Then, in operation 366 in FIG. 13, a wire length constraint of the interconnect is determined by identifying, in the relationship between the wire lengths and the output current $I_{cell\_peak}$ or $I_{cell\_RMS}$ of the 4×NAND gate for the wire width 1w, 2w or 3w, a wire length $L^{cell}_{1W\_max}$, $L^{cell}_{2W\_max}$ or $L^{cell}_{3W\_max}$ that corresponds to an output current $I_{cell\_peak}$ or $I_{cell\_RMS}$ causing the worse of the EM current limit $I_{1W\_EMS}$, $I_{2W\_EMS}$ or $I_{3W\_EMS}$ of the interconnect and the EM current limit $I_{cell\_EMS}$ of the output pin 612 of the 4×NAND gate. In the example shown in FIG. 14, for the wire width 1w, because the EM current limit $I_{1W\_EMS}$ of the interconnect is lower than the EM current limit $I_{cell\_EMS}$ of the output pin 612 of the 4×NAND gate, the interconnect of the wire width 1w is more susceptible to EM than the output pin 612. Therefore, the wire length constraint for the wire width 1w is the wire length that $L^{cell}_{1W\_max}$ that corresponds to the EM current limit $I_{1W\_EMS}$ in the relationship for the wire width 1w. Similarly, the wire length constraint for the wire width 2w is the wire length $L^{cell}_{2W\_max}$ that corresponds to the EM current limit $I_{2W\_EMS}$ in the relationship for the wire width 2w. For the wire width 3w, because the EM current limit $I_{3W\_EMS}$ of the interconnect is higher than the EM current limit $I_{cell\_EMS}$ of the output pin 612 of the 4×NAND gate, the output pin 612 is more susceptible to EM than the interconnect of the wire width 3w. As a result, the wire length constraint for the wire width 3w is the wire length $L^{cell}_{3W\_max}$ that corresponds to the EM current limit $I_{cell\_EMS}$ in the relationship for the wire width 3w.

Figure 15:
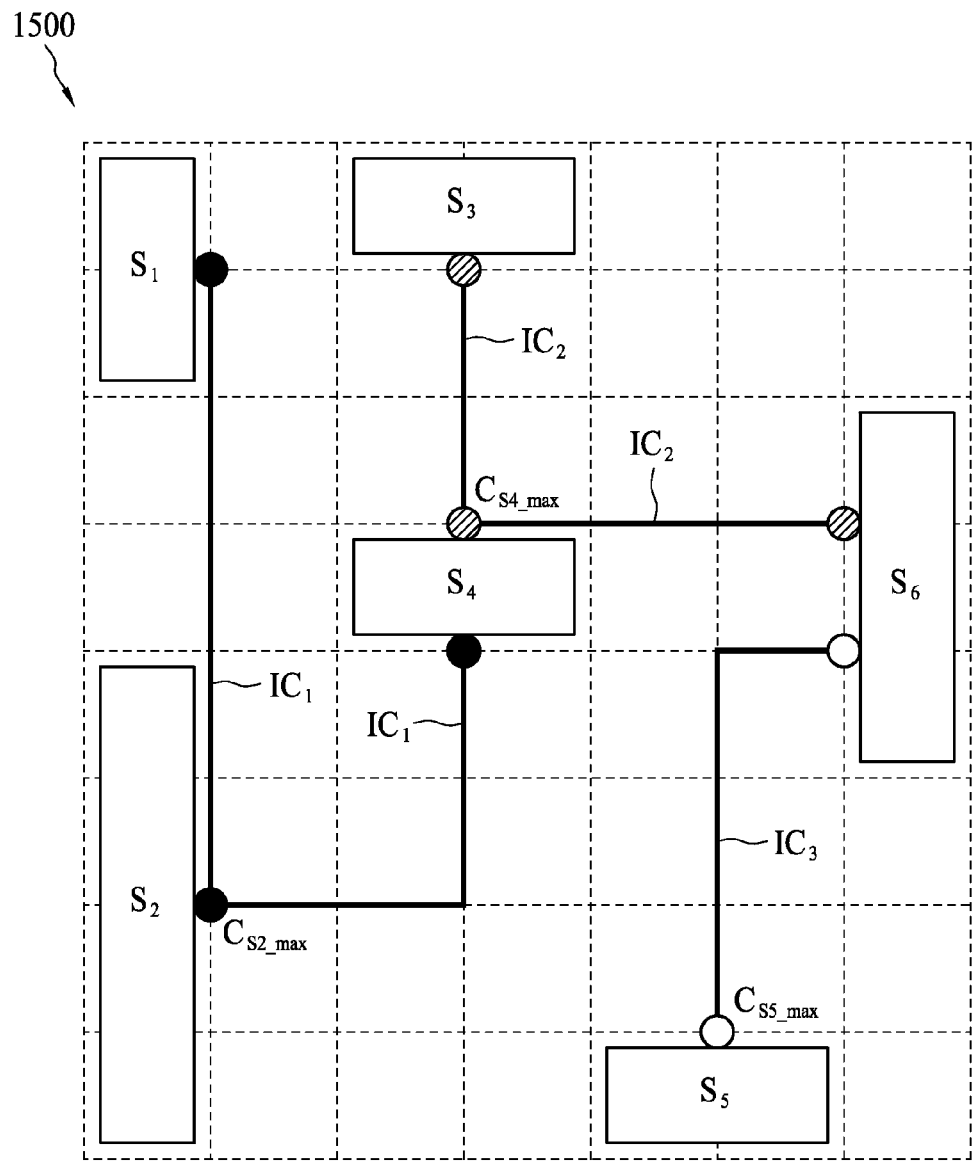
FIG. 15 is a schematic diagram of a design layout in a process of placement in accordance with some embodiments.

FIG. 15 is a schematic diagram of the design layout 1500 in the process of placement in accordance with some embodiments. In the embodiments described with reference to FIG. 2, the place-and-route tool 23 performs placement for a design layout 1500 in accordance with the maximum loading capacitance constraints $C_{S2\_max}$, $C_{S4\_max}$ and $C_{S5\_max}$ obtained from the layout constraint-determining module 224. In the embodiments described with reference to FIG. 4, in operation 42, placement for a design layout 1500 is performed. In operation 44, capacitances and wire lengths of interconnects $IC_1$, $IC_2$, and $IC_3$ to be coupled between the output pins of the cells $S_2$, $S_4$ and $S_5$ and input pins of other cells $S_1$ and $S_4$, $S_3$ and $S_6$, and $S_6$ in the design layout 1500, respectively, are estimated. The cell $S_2$, $S_4$, or $S_5$ drives the other cells $S_1$ and $S_4$, $S_3$ and $S_6$, or $S_6$ through the interconnect $IC_1$, $IC_2$ or $IC_3$. At the placement stage 156 in FIG. 1, interconnects between the cells are not routed yet and therefore, to estimate capacitances and wire lengths of the interconnects, simplified routing is performed. Then, in operation 46, if the maximum loading capacitance constraint $C_{S2\_max}$, $C_{S4\_max}$ or $C_{S5\_max}$ of any cell $S_2$, $S_4$ or $S_5$ is violated, iterative placement for the design layout 1500 is performed in operation 48, and the method 40 loops back to the operation 44 until the maximum loading capacitance constraints $C_{S2\_max}$, $C_{S4\_max}$ and $C_{S5\_max}$ are satisfied. The loading capacitance of a cell such as the cell $S_2$ includes both input capacitances of the cells $S_1$ and $S_4$ driven by the cell $S_2$, and the capacitance of the interconnect $IC_1$ coupled between the cell $S_2$ and the cells $S_1$ and $S_4$. Therefore, to satisfy the maximum loading capacitance constraint $C_{S2\_max}$ of the cell $S_2$, the sum of the input capacitances of the cells $S_1$ and $S_4$, and the capacitance of the interconnect $IC_1$ needs to be within the constraint $C_{S2\_max}$. During iterative placement, if the maximum loading capacitance constraint $C_{S2\_max}$, $C_{S4\_max}$ or $C_{S5\_max}$ of any cell $S_2$, $S_4$ or $S_5$ is violated, the placement of the cell $S_2$, $S_4$ or $S_5$ and/or the placement of at least another cell $S_1$ and $S_4$, $S_3$ and $S_6$ or $S_6$ are adjusted.

As described with reference to FIG. 15, each cell $S_2$, $S_4$ or $S_5$ has the respective maximum loading capacitance constraint $C_{S2\_max}$, $C_{S4\_max}$, or $C_{S5\_max}$. In this way, the capacitive loading of the cell $S_2$, $S_4$ or $S_5$ can be adjusted in accordance with the respective driving strength of the cell $S_2$, $S_4$ or $S_5$, and the respective EMS of the output pin of the cell $S_2$, $S_4$ or $S_5$. Therefore, EM violations or performance degradation due to applying a global maximum loading capacitance constraint to cells with different driving strengths are reduced.

Figure 16:
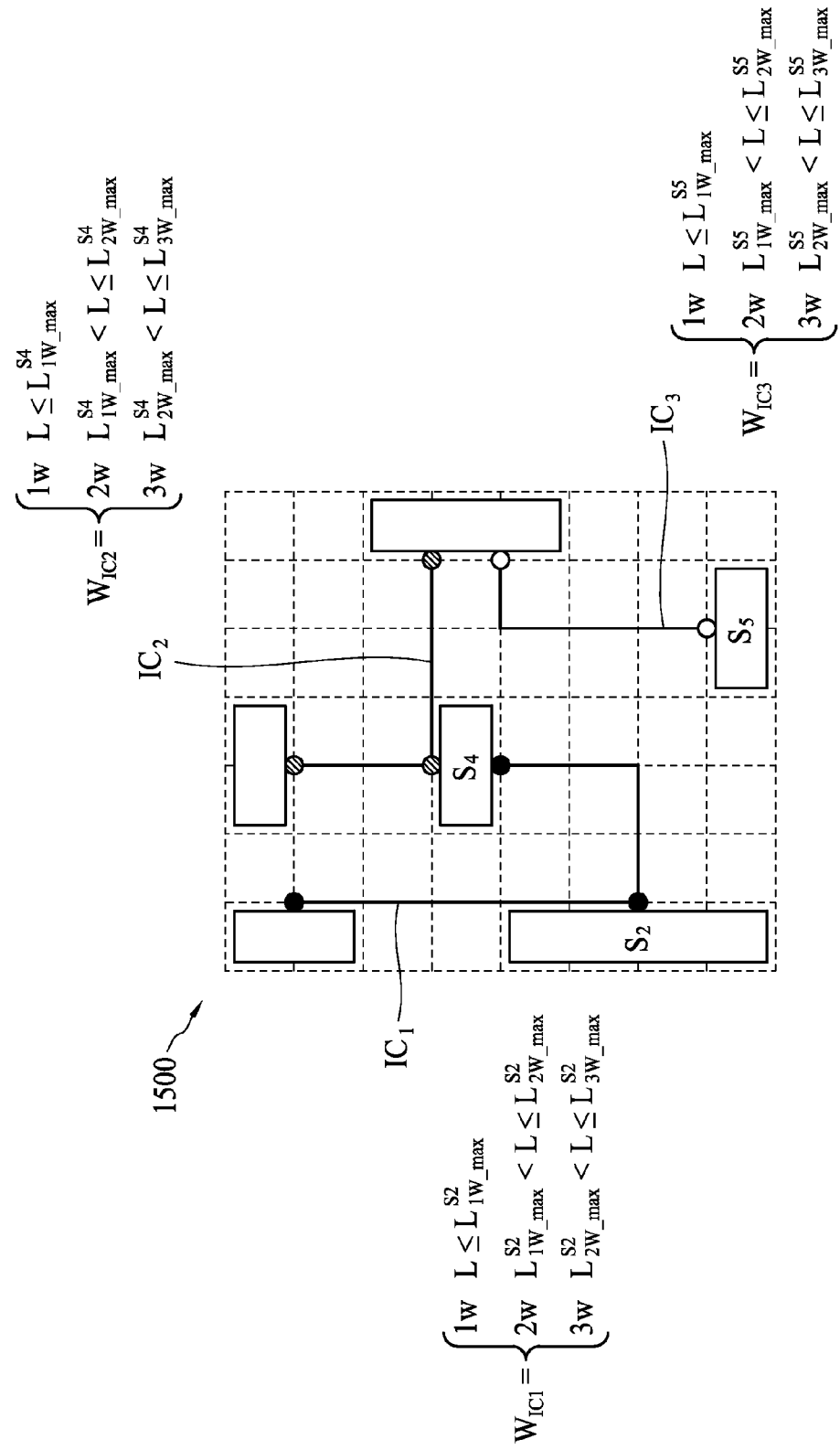
FIG. 16 is a schematic diagram of a design layout in a process of assigning NDRs before routing in according with some embodiments.

FIG. 16 is a schematic diagram of the design layout 1500 in the process of assigning NDRs before routing in according with some embodiments. In the embodiments described with reference to FIG. 2, the place-and-route tool 23 performs routing for the design layout 1500 in accordance with the sets of geometric constraints for the interconnects of the cells obtained from the layout constraint-determining module 224, respectively. In the embodiments described with reference to FIG. 4, in operation 50, an NDR of the interconnect $IC_1$, $IC_2$ or $IC_3$ to be coupled to the output pin of the cell $S_2$, $S_4$ or $S_5$ in the design layout 1500 is set as a wire width 1w, 2w or 3w, in the set of geometric constraints $W_{IC1}$, $W_{IC2}$ or $W_{IC3}$ that has a corresponding wire length constraint $L^{S2}_{1W\_EMS}$, $L^{S2}_{2W\_EMS}$ or $L^{S2}_{3W\_EMS}$, $L^{S4}_{1W\_EMS}$, $L^{S4}_{2W\_EMS}$ or $L^{S4}_{3W\_EMS}$, $L^{S5}_{1W\_EMS}$, $L^{S5}_{2W\_EMS}$ or $L^{S5}_{3W\_EMS}$ that can be satisfied by the estimated wire length L of the interconnect $IC_1$, $IC_2$ or $IC_3$. For example, according to the set of geometric constraints $W_{IC1}$ for the interconnect $IC_1$, if the estimated wire length L of the interconnect $IC_1$ is smaller than or equal to $L^{S2}_{1W\_max}$, then the wire width of the interconnect $IC_1$ is set as 1w. If the estimated wire length L of the interconnect $IC_1$ is greater than $L^{S2}_{1W\_max}$, and is smaller than or equal to $L^{S2}_{2W\_max}$, then the wire width of the interconnect $IC_1$ is set as 2w. If the estimated wire length L of the interconnect $IC_1$ is greater $L^{W2}_{2W\_max}$ and is smaller than or equal to $L^{S2}_{3W\_max}$, then the wire width of the interconnect $IC_1$ is set as 3w. After all the NDRs of the cells $S_2$, $S_4$ and $S_5$ are set in operation 52, routing for the design layout 1500 is performed based on the NDRs.

As described with reference to FIG. 16, each cell $S_2$, $S_4$ or $S_5$ has the respective set of geometric constraints $W_{IC1}$, $W_{IC2}$, or $W_{IC3}$ for the interconnect $IC_1$, $IC_2$ or $IC_3$. In this way, the NDR of the interconnect $IC_1$, $IC_2$ or $IC_3$ can be assigned in accordance with the respective driving strength of the cell $S_2$, $S_4$ or $S_5$, and the wire length L of the interconnect $IC_1$, $IC_2$ or $IC_3$. Compared to a case where an NDR of a cell is set according to a toggle rate of the cell irrespective of the driving strength of the cell, a peak EM current violation of the cell with a high driving strength but a low toggle rate is avoided. Also, an excessively large wire width to prevent RMS EM current violation of the cell with a low driving strength but a high toggle rate is prevented.

Figure 17:
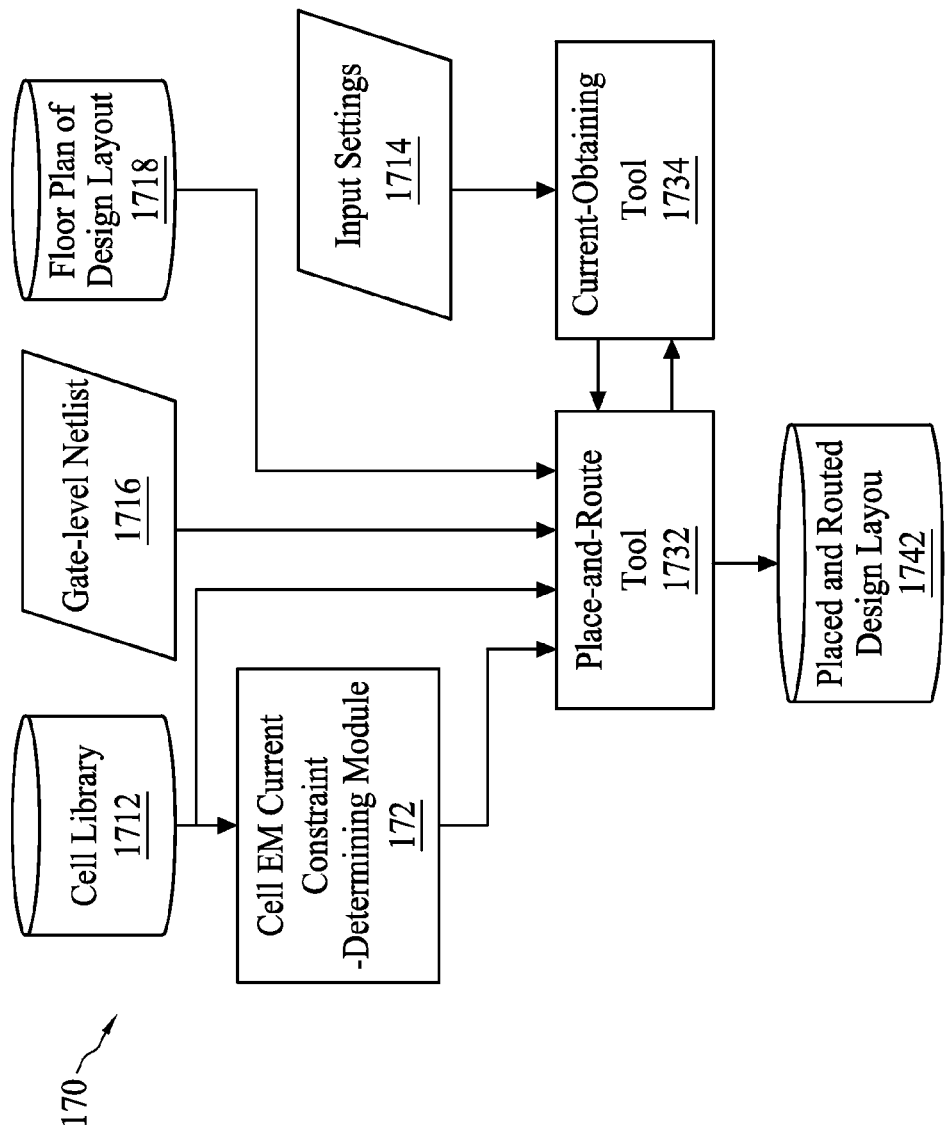
FIG. 17 is a functional block diagram of an EM-aware layout generation system in accordance with other embodiments.

FIG. 17 is a functional block diagram of an EM-aware layout generation system 170 in accordance with other embodiments. The EM-aware layout generation system 170 includes a cell EM current constraint-determining module 172, a place-and-route tool 1732 and a current-obtaining tool 1734. In some embodiments, the cell EM current constraint-determining module 172 is employed at the cell characterization stage 104 in FIG. 1, and the place-and-route tool 1732 and the current-obtaining tool 1734 are used at the placement stage 156 and the routing stage 158. The cell EMS current constraint-determining module 172 is configured to receive cell layouts in a standard cell library 1712, and determine, for each cell, a respective EM current limit of an output pin of the cell as the EM current constraint. Compared to the EM layout constraint-generating tool 22 in FIG. 2, the cell EM current constraint-determining module 172 applies the respective EM current limit of each cells, to the place-and-route tool 173 as a layout constraint that affect a geometry of an interconnect that will be coupled to the cell in a design layout. The place-and-route tool 1732 is configured to receive a gate-level netlist 1716 of a chip design, a floor plan of the design layout 1718, the cell layouts in the standard cell library 1712, and the EM current constraints from the cell EM current constraint-determining module 172, and generate a placement in the design layout 1718. Simplified routing is also performed on the design layout 1718. The current-obtaining tool 1734 receives the placed design layout 1718, and the input settings 1714, extracts a physical netlist of the design layout 1718, and calculates a current at each input pin and output pin of each cell. If the current at the output pin of any cell violates the EM current constraint of the cell, the place-and-route tool 1732 performs iterative placement, and the current-obtaining tool 1734 performs netlist extraction and current calculation until the design layout 1718 is clean of EM current constraint violations. The currents at the output pins of the cells in the design layout 1718 clean of the EM current constraint violations are used to determine NDRs for interconnects to be coupled to the output pins of the cells, respectively. Then the place-and-route tool 1732 performs routing in accordance with the NDRs to generate a placed and routed design layout 1742.

Figure 18:
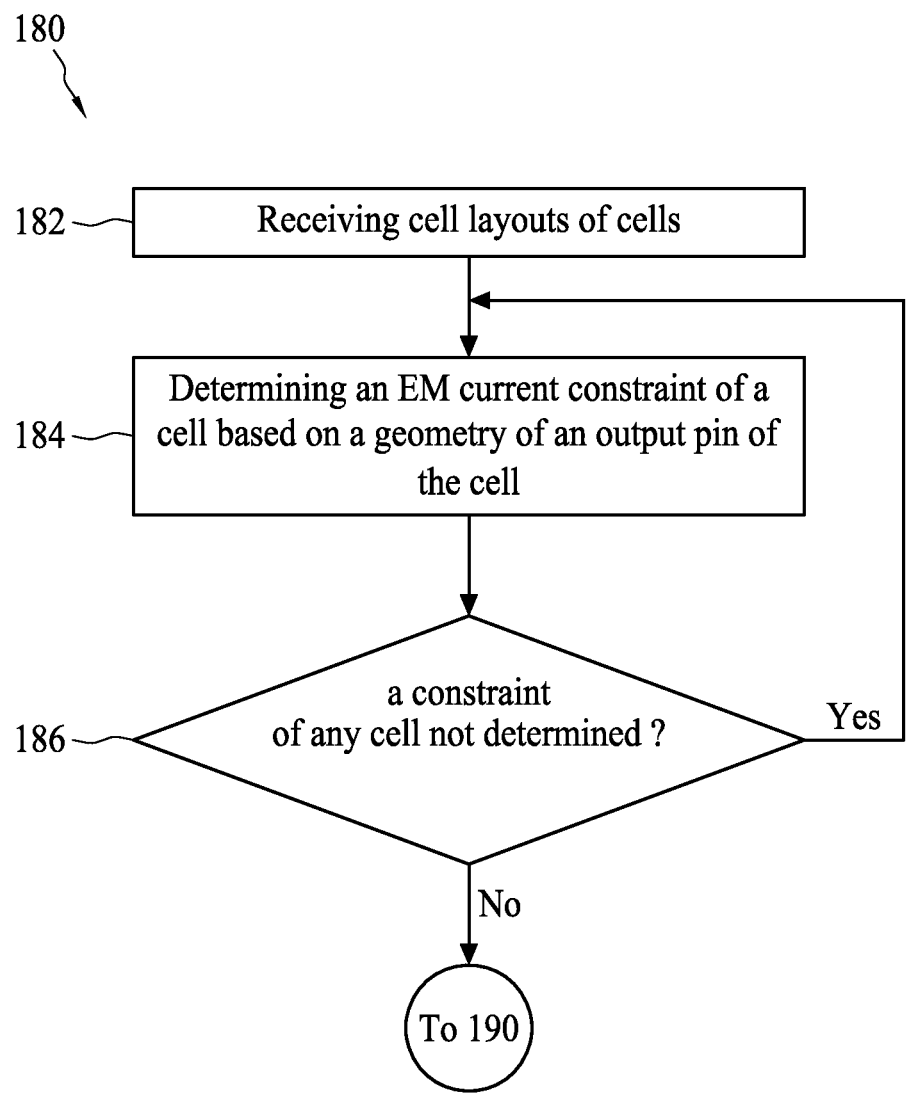
FIG. 18 is a flow diagram of an EM current constraint-generating method in accordance with some embodiments.

FIG. 18 is a flow diagram of an EM current constraint-generating method 180 in accordance with some embodiments. Compared to the method 30 in FIG. 3, instead of generating the respective maximum loading capacitance constraint and the respective set of geometric constraints for an interconnect coupled to the output pin of each cell, a respective EM current constraint is generated for each cell. In operation 182, cell layouts of cells are received. In operation 184, an EM current constraint of a cell is determined based on a geometry of an output pin of the cell. The EM current constraint is determined similarly to the EM current limit described with reference to FIGS. 7A and 7B. In operation 186, if an EM current constraint of any cell is not determined, the method 180 loops back to the operation 184 to determine the EM current constraint for another cell; otherwise the EM current constraints for the cells are generated and are available for use in an EM-aware placement and routing method 190 in FIG. 19.

Figure 19:
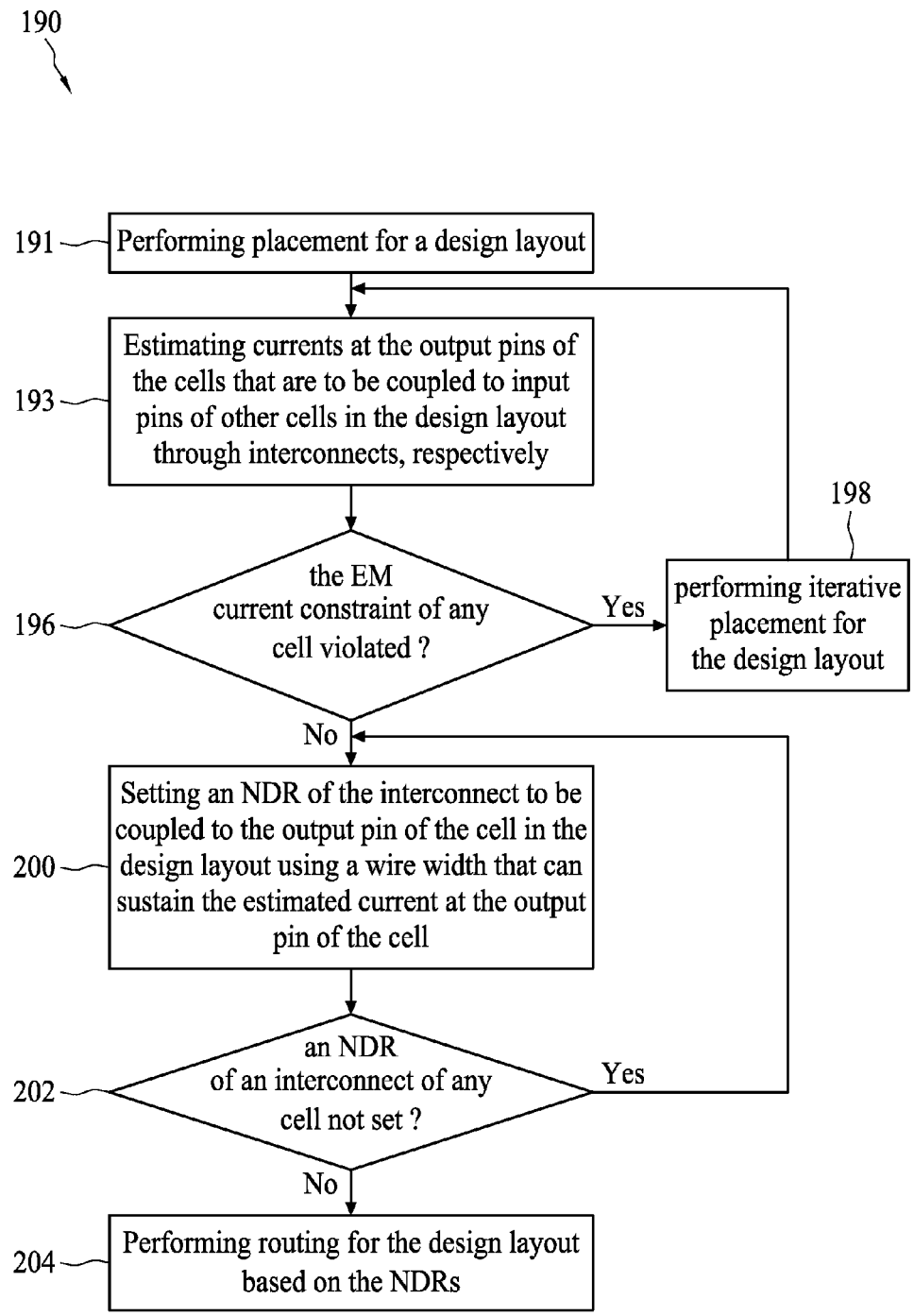
FIG. 19 is a flow diagram of an EM-aware placement and routing method in accordance with other embodiments.

FIG. 19 is a flow diagram of the EM-aware placement and routing method 190 in accordance with other embodiments. Compared to the method 40 in FIG. 4, the method 190 performs iterative placement until the EM current constraints obtained in FIG. 18 are satisfied and then sets NDRs according to estimated currents at the output pins of the cells, respectively. In operation 191, placement for a design layout is performed. In operation 193, currents at the output pins of the cells that are to be coupled to input pins of other cells in the design layout through interconnects are estimated, respectively. In operation 196, if the EM current constraint of any cell is violated, then the method 190 performs iterative placement for the design layout in operation 198, and loops back to the operation 193; otherwise, the method proceeds to the operation 200. In operation 200, an NDR of the interconnect to be coupled to the output pin of the cell in the design layout is set using a wire width that can sustain the estimated currents at the output pin of the cell. In operation 202, if an NDR of an interconnect of any cell is not set, the method 190 loops back to operation 200 to set the NDR for another cell; otherwise, in operation 204, routing is performed for the design layout based on the NDRs.

Figure 20:
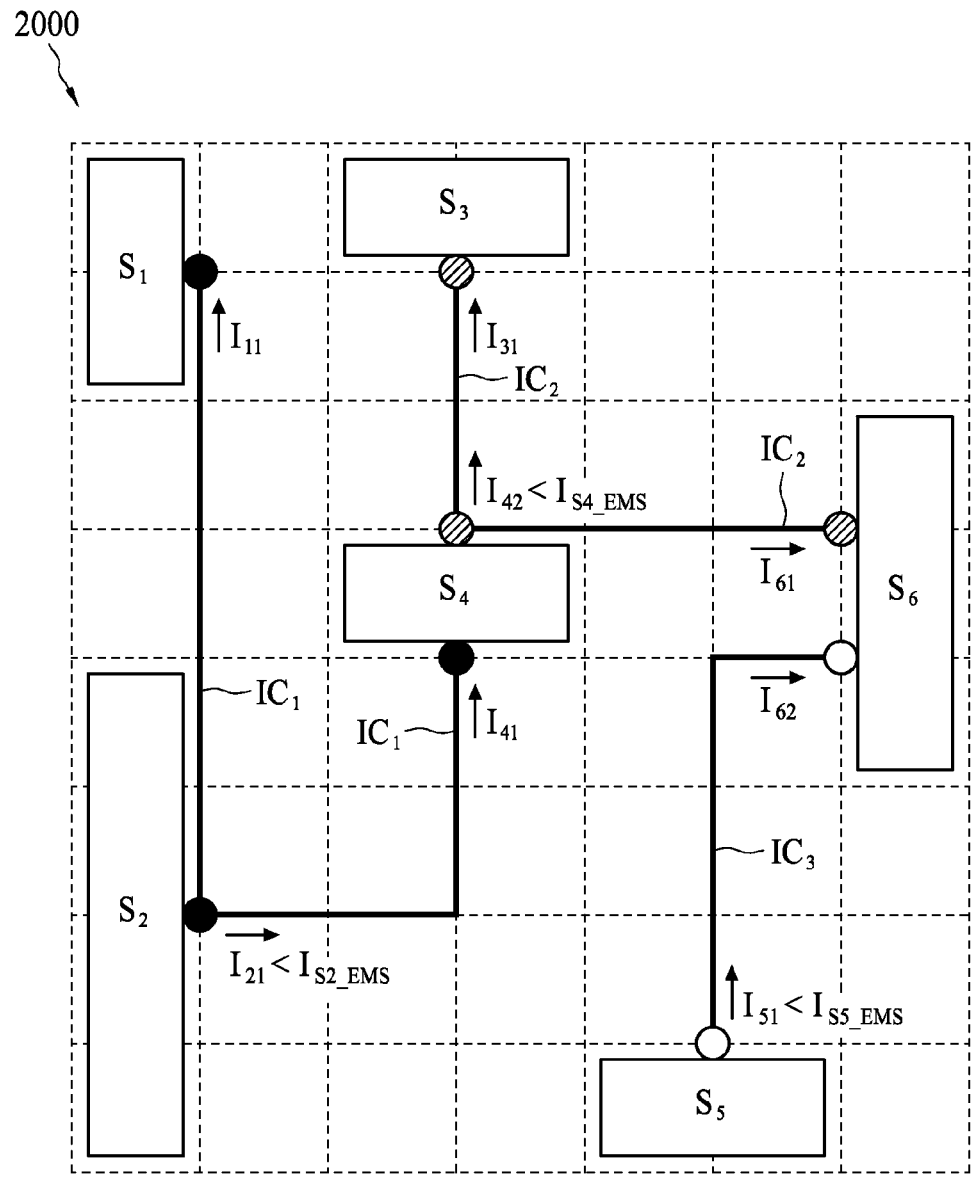
FIG. 20 is a schematic diagram of the design layout in a process of placement in accordance with some embodiments.

FIG. 20 is a schematic diagram of the design layout 2000 in the process of placement in accordance with some embodiments. In the embodiments described with reference to FIG. 17, the place-and-route tool 1732 generates a placement in the design layout 2000. Simplified routing is also performed on the design layout 2000. The current-obtaining tool 1734 receives the design layout 2000, extracts a physical netlist of the design layout 2000, and calculates a current $I_{11}$, $I_{31}$, $I_{41}$, $I_{61}$ or $I_{62}$ at each input pin of each cell $S_1$, $S_3$, $S_4$, or $S_6$, and a current $I_{21}$, $I_{42}$, or $I_{51}$ at a respective output pin of each cell $S_2$, $S_4$ or $S_5$. If the current $I_{21}$, $I_{42}$, or $I_{51}$ at the output pin of any cell $S_2$, $S_4$ or $S_5$ violates the EM current constraint $I_{S2\_EMS}$, $I_{S4\_EMS}$, or $I_{S5\_EMS}$ of the cell $S_2$, $S_4$ or $S_5$, the place-and-route tool 1732 performs iterative placement, and the current-obtaining tool 1734 performs netlist extraction and current calculation until the design layout 2000 is clean of EM current constraint violations. In the embodiments described with reference to FIG. 19, in operation 193, currents at $I_{21}$, $I_{42}$ and $I_{51}$ at the output pins of the cells $S_2$, $S_4$ and $S_5$ that are to be coupled to input pins of other cells $S_1$ and $S_4$, $S_3$ and $S_6$, and $S_6$ in the design layout 2000 through interconnects $IC_1$, $IC_2$ and $IC_3$, respectively, are estimated respectively. In operation 196, if the EM current constraint $I_{S2\_EMS}$, $I_{S4\_EMS}$ or $I_{S5\_EMS}$ of any cell $S_2$, $S_4$ or $S_5$ is violated, the method 190 performs iterative placement until all the EM current constraints $I_{S2\_EMS}$, $I_{S4\_EMS}$ and $I_{S5\_EMS}$ are satisfied.

Referring to FIG. 20, in the embodiments described with reference to FIG. 17, after the design layout 2000 satisfies all of the EM current constraints $I_{S2\_EMS}$, $I_{S4\_EMS}$, and $I_{S5\_EMS}$, the current $I_{21}$, $I_{42}$ or $I_{51}$ at the output pin of each cell $S_2$, $S_4$ or $S_5$ is used to determine a respective NDR for the interconnect $IC_1$, $IC_2$ or $IC_3$ to be coupled to the output pin of the cell $S_2$, $S_4$ or $S_5$. In the embodiments described with reference to FIG. 19, an NDR of the interconnect $IC_1$, $IC_2$ or $IC_3$ to be coupled to the output pin of the cell $S_2$, $S_4$ or $S_5$ in the design layout 2000 is set using a wire width $1w$, $2w$, or $3w$ that can sustain the estimated current $I_{21}$, $I_{42}$ or $I_{51}$ at the output pin of the cell $S_2$, $S_4$ or $S_5$. In some embodiments, current density limits at corresponding temperatures of a wire are defined as EM design rules in a design rule manual. Based the corresponding EM design rule, a predetermined thickness of each segment of the interconnect $IC_1$, $IC_2$ or $IC_3$, and the estimated current $I_{21}$, $I_{42}$ or $I_{51}$, a wire width for each segment of the interconnect $IC_1$, $IC_2$ or $IC_3$ can be calculated. Other operations in FIGS. 17 to 19 are similar to those described with references to FIGS. 2 to 16 and are omitted here.

Figure 21:
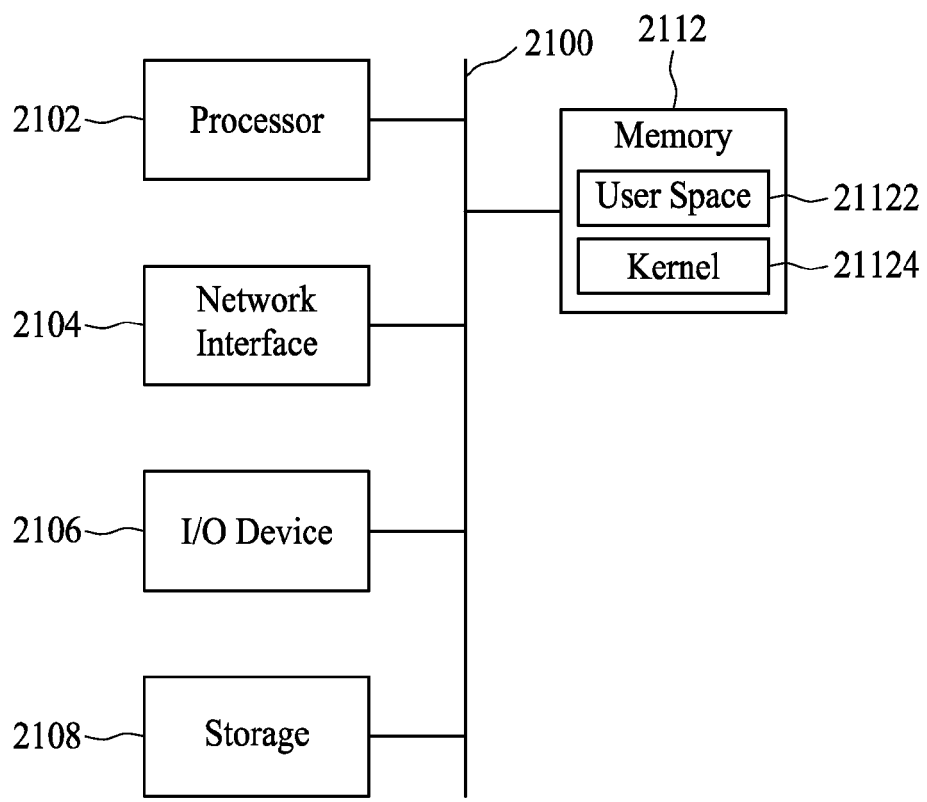
FIG. 21 is a block diagram of a hardware system for implementing the software system embodiments described with references to FIG. 2 or 17, and the method embodiments described with reference to FIGS. 3 and 4, or FIGS. 18 and 19 in accordance with some embodiments.

FIG. 21 is a block diagram of a hardware system 2100 for implementing the software system embodiments described with references to FIG. 2 or 17, and the method embodiments described with reference to FIGS. 3 and 4, or FIGS. 18 and 19 in accordance with some embodiments. The system 2100 includes at least one processor 2102, a network interface 2104, an input and output (I/O) device 2106, a storage 2108, a memory 2112, and a bus 2110. The bus 2110 couples the network interface 2104, the I/O device 2106, the storage 2108 and the memory 2112 to the processor 2102.

In some embodiments, the memory 2112 comprises a random access memory (RAM) and/or other volatile storage device and/or read only memory (ROM) and/or other non-volatile storage device. The memory 2112 includes a kernel 21124 and user space 21122, configured to store program instructions to be executed by the processor 2102 and data accessed by the program instructions.

In some embodiments, the network interface 2104 is configured to access program instructions and data accessed by the program instructions stored remotely through a network. The I/O device 2106 includes an input device and an output device configured for enabling user interaction with the system 2100. The input device comprises, for example, a keyboard, a mouse, etc. The output device comprises, for example, a display, a printer, etc. The storage device 2108 is configured for storing program instructions and data accessed by the program instructions. The storage device 2108 comprises, for example, a magnetic disk and an optical disk.

In some embodiments, when executing the program instructions, the processor 2102 is configured to as the software system 20 or 170 described with reference to FIG. 2 or 17 and perform the methods 30 and 40, or 180 and 190 described with reference to FIGS. 3 and 4 or FIGS. 18 and 19.

In some embodiments, the program instructions are stored in a non-transitory computer readable recording medium such as one or more optical disks, hard disks and non-volatile memory devices.

Some embodiments have one or a combination of the following features and/or advantages. In some embodiments, to perform EM-aware placement and/or routing for a design layout, each cell has a respective constraint that affects a geometry of an interconnect coupled to the output pin of the cell. The constraint is determined based on a geometry of the output pin of the cell. In some embodiments, the constraint is a maximum loading capacitance constraint. By applying the respective maximum loading capacitance to each cell, a respective driving strength of the cell is considered, and an EM violation caused by an inappropriately low global maximum loading capacitance constraint to a high drive cell, and a timing violation caused by an inadequately high global maximum loading capacitance constraint to a low drive cell are prevented. In some embodiments, the constraint is a set of geometric constraints of the interconnect to be coupled to the output pin of the cell. By applying the respective set of geometric constraints for the interconnect coupled to each cell, a respective driving strength of the cell is considered, and an EM violation caused by assigning a small wire width to a high drive cell with a low toggle rate, and inefficiency resulted from assigning an excessively large wire width to a low drive cell with a high toggle rate are prevented. In other embodiments, the constraint is an EM current constraint at the output pin of the cell. Similarly, by applying the respective EM current constraint at the output pin of each cell, the EM current constraint for the cell is more adequate considering the driving strength and the geometry of the output pin of the cell. Further, because the constraint is determined considering the geometry of the output pin of the cell, a situation where an EM violation occurs in the output pin instead of at the interconnect coupled to the output pin due to ignoring the EMS of the output pin is avoided.

In some embodiments, in a method performed by at least one processor, cell layouts of a plurality of cells are received by the at least one processor. For each cell, a respective constraint that affects a geometry of an interconnect to be coupled to an output pin of the cell in a design layout is determined by the at least one processor based on a geometry of the output pin of the cell in the cell layout.

In some embodiments, a system includes at least one processor configured to execute program instructions which configure the at least one processor as a layout constraint-generating tool, and at least one memory configured to store the program instructions. The layout constraint-generating tool is configured to receive cell layouts of a plurality of cells, and determine, for each cell, a respective constraint that affects a geometry of an interconnect to be coupled to an output pin of the cell in a design layout based on a geometry of the output pin of the cell in the cell layout.

In some embodiments, in a method performed by at least one processor, cell layouts of a plurality of cells are received by the at least one processor. For each cell and with respect to each different first geometric characteristic of an interconnect to be coupled to an output pin of the cell in the cell layout, a respective relationship between second geometric characteristics of the interconnect and output behaviors of the cell is obtained by the at least one processor. An electromigration susceptibility (EMS) of the interconnect is determined based on the first geometric characteristic of the interconnect by the at least one processor. Further, a geometric constraint of the interconnect is determined using a second geometric characteristic in the relationship by the at least one processor. The second geometric characteristic corresponds to an output behavior causing the EMS of the interconnect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, comprising:
   receiving, by the at least one processor, cell layouts of a plurality of cells; and
   for each cell of the plurality of cells and with respect to each first geometric characteristic of a plurality of first geometric characteristics considered for a first interconnect coupled to an output pin of the cell in the cell layout,
      obtaining, by the at least one processor, a respective relationship of a plurality of pairs of second geometric characteristic and output behaviors,
         each second geometric characteristic and each output behavior of the plurality of pairs of second geometric characteristic and output behavior being considered for the first interconnect and being of the cell, respectively, and
         the first geometric characteristic being orthogonal to each second geometric characteristic of the plurality of pairs of second geometric characteristic and output behavior;
      determining, by the at least one processor, respective electromigration susceptibility (EMS) of the first interconnect having the first geometric characteristic; and
      determining, by the at least one processor, a respective geometric constraint of the first interconnect using a first pair of second geometric characteristic and output behavior in the respective relationship,
         the output behavior in the first pair of second geometric characteristic and output behavior causing the respective EMS of the first interconnect.

2. The method of claim 1, wherein,
   the method further comprises:
      for each cell of the plurality of cells, determining a respective EMS of an output pin of the cell based on a geometric characteristic of the output pin of the cell in the cell layout; and
      for each cell of the plurality of cells and with respect to each first geometric characteristic of the plurality of first geometric characteristics considered for the first interconnect coupled to the output pin of the cell in the cell layout, the respective geometric constraint of the first interconnect is determined using the first pair of second geometric characteristic and output behavior in the respective relationship, the output behavior in the first pair of second geometric characteristic and the output behavior causing the worse of the respective EMS of the the first interconnect having the first geometric characteristic and the respective EMS of the output pin of the cell.

3. The method of claim 1, wherein the respective EMS of the first interconnect having the first geometric characteristic is reflected by a current limit calculated by applying the first geometric characteristic of the first interconnect to an EM design rule; and each output behavior in the plurality of pairs of second geometric characteristic and output behavior is an output current.

4. The method of claim 1, further comprising:

placing a first cell in the plurality of cells and a second cell in the plurality of cells in the design layout;

obtaining a third geometric characteristic of a second interconnect coupling the output pin of the first cell to an input pin of the second cell;

selecting a fourth geometric characteristic of the second interconnect from the plurality of first geometric characteristics such that the third geometric characteristic of the second interconnect does not exceed the geometric constraint corresponding to the first cell and the fourth geometric characteristic; and routing the second interconnect based on the selected fourth geometric characteristic.

5. The method of claim 1, further comprising:

for each cell of the plurality of cells, determining a respective electrical constraint using an EMS of the output pin of the cell, the electrical constraint being used for compared with an electrical characteristic of a second interconnect coupled to the output pin of the cell during generation of a design layout, the electrical characteristic of the second interconnect being corresponding to a third geometric characteristic of the second interconnect, and the third geometric characteristic having the same direction as each second geometric characteristic in the respective relationship of each first geometric characteristic of the plurality of first geometric characteristics.

6. The method of claim 5, wherein the electrical constraint is a loading capacitance constraint.

7. The method of claim 5, wherein the electrical constraint is an output current constraint.

8. The method of claim 5, wherein for each cell of the plurality of cells, determining the respective electrical constraint comprises:

simulating a plurality of output currents of the cell with respect to a first input vector and a range of electrical characteristics, respectively; and determining a first electrical characteristic in the range of electrical characteristics that corresponds to a first output current in the plurality of output currents reflecting the EMS of the output pin of the cell as the electrical constraint, the first input vector being selected from a plurality of input vectors that cause different transitions in a plurality of output voltages of the cell, respectively, and the transition caused by the first input vector resulting in the first output current.

9. The method of claim 5, further comprising:

placing a first cell in the plurality of cells and a second cell in the plurality of cells in the design layout; and performing at least one of a first set of operations and a second set of operations:

a first set of operations comprising:

obtaining an electrical characteristic of a first interconnect coupling the output pin of the first cell to an input pin of the second cell; and adjusting placement of the first cell and/or the second cell in the design layout until the electrical characteristic of the first interconnect satisfy the electrical constraint corresponding to the first cell; and a second set of operations comprising:

obtaining a third geometric characteristic of the first interconnect;

selecting a fourth geometric characteristic of the first interconnect from the plurality of first geometric characteristics such that the third geometric characteristic of the first interconnect does not exceed the geometric constraint corresponding to the first cell and the fourth geometric characteristic; and routing the first interconnect based on the selected fourth geometric characteristic.

10. A system, comprising:

at least one processor, configured to execute program instructions which configure the at least one processor as a layout constraint-generating tool comprising:

a layout constraint-determining module configured:

for each cell of the plurality of cells received by the layout constraint-generating tool and with respect to each first geometric characteristic of a plurality of first geometric characteristics considered for a first interconnect coupled to an output pin of the cell in the cell layout, to obtain a respective relationship of a plurality of pairs of second geometric characteristic and output behavior, each second geometric characteristic and each output behavior of the plurality of pairs of second geometric characteristic and output behavior being considered for the first interconnect and being of the cell, respectively, and the first geometric characteristic being orthogonal to each second geometric characteristic of the plurality of pairs of second geometric characteristic and output behavior;

to determine a respective electromigration susceptibility (EMS) of the first interconnect having first geometric characteristic; and to determine a respective geometric constraint of the first interconnect using a first pair of second geometric characteristic and output behavior in the respective relationship, the output behavior in the first pair of second geometric characteristic and the output behavior causing the respective EMS of the first interconnect; and at least one memory configured to store the program instructions.

11. The system of claim 10, wherein the layout constraint-generating tool further comprises:

a cell electromigration susceptibility (EMS)-determining module configured for each cell of the plurality of cells, to determine a respective EMS of an output pin of the cell based on a geometric characteristic of the output pin of the cell in the cell layout; and for each cell of the plurality of cells and with respect to each first geometric characteristic of the plurality of first geometric characteristics considered for the first interconnect coupled to the output pin of the cell in the cell layout, the respective geometric constraint of the first interconnect is determined by the layout constraint-determining module using the first pair of second geometric characteristic and output behavior in the respective relationship, the output behavior in the first pair of second geometric characteristic and the output behavior causing the worse of the respective EMS of the first interconnect having the first geometric characteristic and the respective EMS of the output pin of the cell.

12. The system of claim 10, wherein
the respective EMS of the first interconnect having the first geometric characteristic is reflected by a current limit calculated by applying the first geometric characteristic of the first interconnect to an EM design rule; and
each output behavior in the plurality of pairs of second geometric characteristic and output behavior is an output current.

13. The system of claim 10, further comprising:
a place-and-route tool configured to:
place a first cell in the plurality of cells and a second cell in the plurality of cells in the design layout;
obtain a third geometric characteristic of a second interconnect coupling the output pin of the first cell to an input pin of the second cell;
select a fourth geometric characteristic of the second interconnect from the plurality of first geometric characteristics such that the third geometric characteristic of the second interconnect does not exceed the geometric constraint corresponding to the first cell and the fourth geometric characteristic; and
route the second interconnect based on the selected fourth geometric characteristic.

14. The system of claim 10, wherein
the layout constraint-determining module is further configured:
for each cell of the plurality of cells, to determine a respective electrical constraint using an EMS of the output pin of the cell,
the electrical constraint being used for compared with an electrical characteristic of a second interconnect coupled to the output pin of the cell during generation of a design layout,
the electrical characteristic of the second interconnect being corresponding to a third geometric characteristic of the second interconnect, and
the third geometric characteristic having the same direction as each second geometric characteristic in the respective relationship of each first geometric characteristic of the plurality of first geometric characteristics.

15. The system of claim 14, wherein
the electrical constraint is a loading capacitance constraint.

16. The system of claim 14, wherein
the electrical constraint is an output current constraint.

17. The system of claim 14, the layout constraint-determining module determines the respective electrical constraint by performing at least one operation comprising:

simulating a plurality of output currents of the cell with respect to a first input vector and a range of electrical characteristics, respectively; and determining a first electrical characteristic in the range of electrical characteristics that corresponds to a first output current in the plurality of output currents reflecting the EMS of the output pin of the cell as the electrical constraint, the first input vector being selected from a plurality of input vectors that cause different transitions in a plurality of output voltages of the cell, respectively, and the transition caused by the first input vector resulting in the first output current.

18. The system of claim 14, further comprising:
a place-and-route tool configured to:
place a first cell in the plurality of cells and a second cell in the plurality of cells in the design layout; and
perform at least one of a first set of operations and a second set of operations:
a first set of operations comprising:
obtaining an electrical characteristic of a first interconnect coupling the output pin of the first cell to an input pin of the second cell; and
adjusting placement of the first cell and/or the second cell in the design layout until the electrical characteristic of the first interconnect satisfy the electrical constraint corresponding to first cell; and
a second set of operations comprising:
obtaining a third geometric characteristic of the first interconnect;
selecting a fourth geometric characteristic of the first interconnect from the plurality of first geometric characteristics such that the third geometric characteristic of the first interconnect does not exceed the geometric constraint corresponding to the first cell and the fourth geometric characteristic; and
routing the first interconnect based on the selected fourth geometric characteristic.

19. A method, performed by at least one processor, comprising:
placing, by the at least one processor, a first cell and a second cell in a design layout;
obtaining, by the at least one processor, an electrical characteristic of a first interconnect coupling an output pin of the first cell to an input pin of the second cell;
adjusting, by the at least one processor, placement of the first cell and/or the second cell in the design layout until the electrical characteristic of the first interconnect satisfy an electrical constraint corresponding to the first cell,
the electrical constraint determined using an electromigration susceptibility (EMS) of the output pin of the first cell; and
obtaining, by the at least one processor, a first geometric characteristic of the first interconnect having the electrical characteristic satisfying the electrical constraint;
selecting, by the at least one processor, a second geometric characteristic of the first interconnect so that the first geometric characteristic of the first interconnect is within a geometric constraint,
the first geometric characteristic being orthogonal to the second geometric characteristic, and
the geometric constraint being determined based on the EMS of the first interconnect having the second geometric characteristic; and routing, by the at least one processor, the first interconnect based on the selected second geometric characteristic of the first interconnect.

20. The method of claim 19, wherein the geometric constraint is determined based on the worse of the EMS of the first interconnect having the second geometric characteristic and the EMS of the output pin of the first cell.

* * * * *